(12) United States Patent
Uetake et al.

(10) Patent No.: US 7,755,259 B2
(45) Date of Patent: Jul. 13, 2010

(54) AIRTIGHT TERMINAL

(75) Inventors: Hiroaki Uetake, Chiba (JP); Yuki Hoshi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/355,239

(22) Filed: Jan. 16, 2009

(65) Prior Publication Data
US 2009/0152992 A1    Jun. 18, 2009

Related U.S. Application Data

(62) Division of application No. 11/586,252, filed on Oct. 24, 2006, now Pat. No. 7,493,680.

(30) Foreign Application Priority Data
Oct. 24, 2005   (JP)   ............................. 2005-308718

(51) Int. Cl.
*H01L 41/09*   (2006.01)
(52) U.S. Cl. ..................................... 310/344
(58) Field of Classification Search .................. 310/344
See application file for complete search history.

(56) References Cited

U.S. PATENT DOCUMENTS

| | | | |
|---|---|---|---|
| 2,445,719 A * | 7/1948 | Sylvester | ..................... 310/318 |
| 2,577,576 A | 12/1951 | Glickman et at | |
| 5,184,043 A | 2/1993 | Yoshinaga | |
| 5,504,460 A | 4/1996 | Ikeda et al. | |
| 5,918,354 A | 7/1999 | Ikegami et al. | |
| 6,005,329 A | 12/1999 | Ikeda et al. | |
| 6,488,879 B1 | 12/2002 | Moriyasu et al. | |
| 7,392,171 B2 * | 6/2008 | Blasi et al. | ..................... 703/15 |
| 2008/0129149 A1 * | 6/2008 | Numata et al. | ............... 310/328 |

FOREIGN PATENT DOCUMENTS

| | | |
|---|---|---|
| JP | H08-316761 A | 11/1996 |
| JP | 2000-285991 A | 10/2000 |
| JP | 2002-43886 A | 2/2002 |

* cited by examiner

*Primary Examiner*—Thomas M Dougherty
(74) *Attorney, Agent, or Firm*—Brinks Hofer Gilson & Lione

(57) ABSTRACT

To provide an airtight terminal and a piezoelectric vibrator having a strong rigidity of a lead despite a small-sized constitution, and provide a method of fabricating an airtight terminal constituting a lead penetrating inside of a stem by one piece and a piezoelectric vibrator with an excellent yield. A stem 11 filled with a filling member 13 is penetrated only with one piece of a lead 12 formed from a lead frame. As an electric terminal, a conductive lead 16 connected to the stem 11 is provided other than the lead 12. The lead 12 and the conductive lead 16 of an airtight terminal 10 constituted by the stem 11, the lead 12, the filling member 13, the conductive lead 16 are connected to a piezoelectric vibrating piece 20, further, the stem 11 is capped to a case 30 to thereby constitute a piezoelectric vibrator 1.

13 Claims, 18 Drawing Sheets

FIG. 2A  FIG. 2B  FIG. 2C
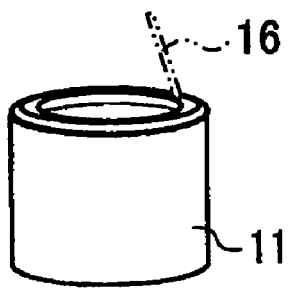 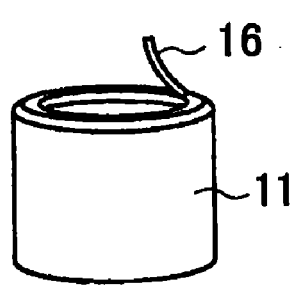 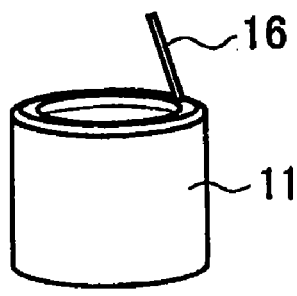
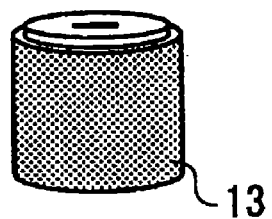 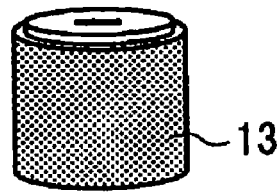 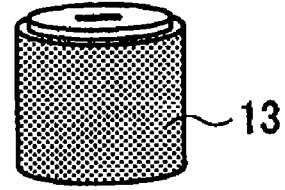
 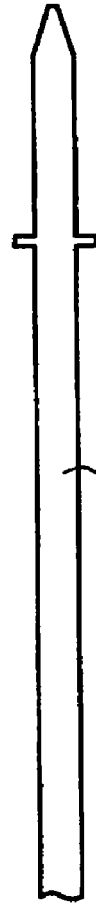 

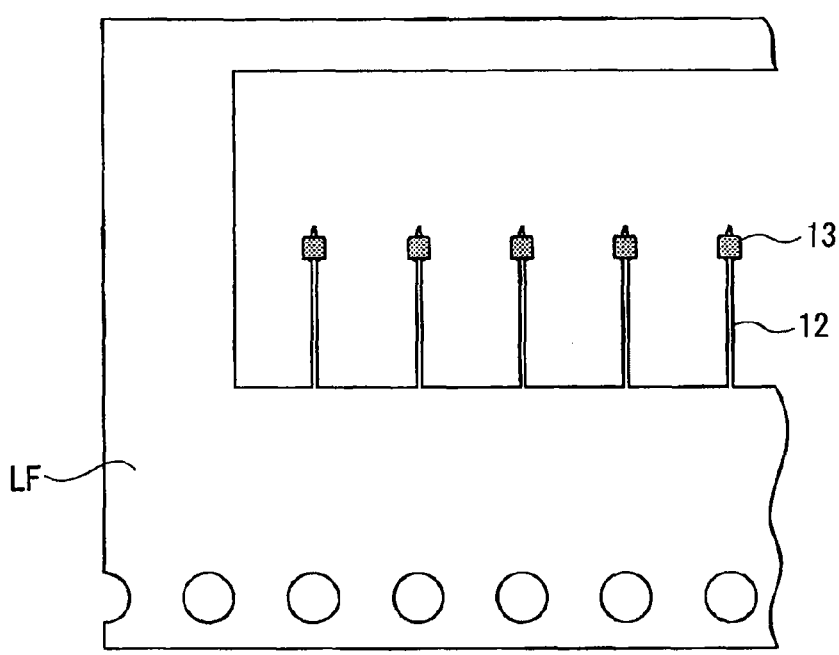 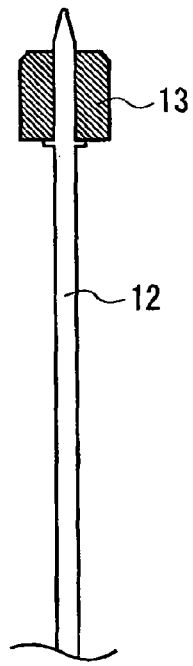
FIG. 11A    FIG. 11B
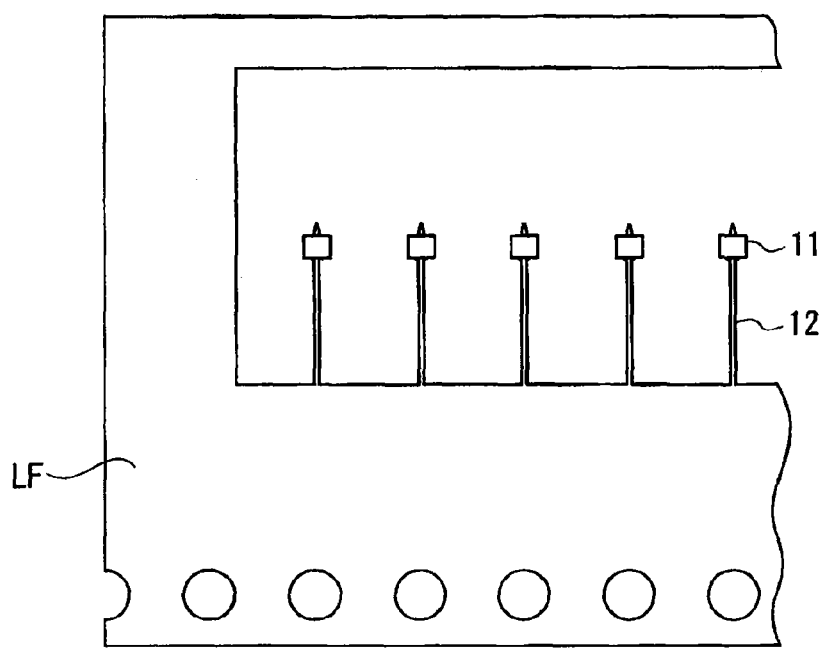 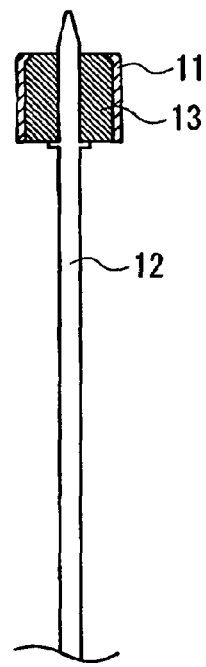
FIG. 12A    FIG. 12B

AIRTIGHT TERMINAL

RELATED APPLICATIONS

This application is a divisional application of U.S. application Ser. No. 11/586,252 filed on Oct. 24, 2006, which claims priority to Japanese Patent Application No. JP2005-308718 filed on Oct. 24, 2005, the contents of which are hereby incorporated by references entirely.

BACKGROUND OF THE INVENTION

1. Field of the Invention

The present invention relates to an airtight terminal and its fabricating method, a piezoelectric vibrator and its fabricating method, an oscillator, an electronic apparatus and a radio wave timepiece.

2. Description of the Related Art

A piezoelectric vibrator is used as a reference oscillation source of an electronic apparatus, an oscillation piece of an oscillator, a clock source of a microcomputer or the like. As a package of the piezoelectric vibrator, a ceramic package constituted by a box type shape, a cylinder package type including a lead is commonly used.

Here, a constitution of a piezoelectric vibrator of a cylinder package type of a background art will be explained.

FIGS. 21A and 21B show a background art of a piezoelectric vibrator 01 of a cylinder package type, wherein FIG. 21A is a perspective view showing a total constitution, and FIG. 21B is a partial sectional view showing a state of cutting a portion of a stem along a longitudinal direction of a lead.

The piezoelectric vibrator 01 is constituted by an airtight terminal 010, a piezoelectric vibrating piece 020, a case 030 as principal members.

Among the principal parts, the airtight terminal 010 is constituted by a stem 011 in a cylindrical shape, 2 pieces of parallel leads 012 arranged to penetrate inside of the stem 011, a filling member 013 filled at inside of the stem 011 for fixing 2 pieces of the leads 012 at inside of the stem 011.

The stem 011 is formed by, for example, 42 alloy (Fe—Ni), and a surface thereof is subjected to plating 014 having a thickness of substantially 10 μm through 15 μm. As the plating 014, Cu plating is carried out as a matrix, and a tin lead alloy plating (Sn—Pb plating) is carried out thereon as finish plating. Further, in FIG. 21B, the plating thickness of the plating 014 is exaggeratedly illustrated.

2 pieces of the leads 012 comprising solid round bars made of a metal are supported at inside of the stem 011 in a state of penetrating inside of the stem 011, that is, a state of penetrating the filling member 013 filled at inside of the stem 011 by way of the filling member 013.

In other words, 2 pieces of the leads 012 are protruded from one end face (end face of upper side shown in FIG. 21A) and protruded from other end face (end face of lower side shown in FIG. 21A) of the stem 011 by interposing the stem 011 filled with the filling member 013 at inside thereof. Generally, a portion thereof protruded from the one end face (end face of upper side shown in FIG. 21A) of the stem 011 is referred to as "inner lead 012a" and a portion thereof protruded from the other end face (end face of lower side shown in FIG. 21A) of the stem 011 is referred to as "outer lead 012b".

A surface of the lead 012 (including both of inner leads 012a and outer lead 012b) is subjected to plating 015 having a thickness of substantially 10 μm through 15 μm. As the plating 015, for example, Cu plating is carried out as matrix, and Sn—Pb plating is carried out thereon as finish plating.

The filling member 013 is formed by, for example, borosilicate glass, and a thermal expansion rate thereof becomes substantially equal to that of the stem 011 or the lead 012. The filling member 013 is filled in a space at inside of the stem 011 and supports the lead 012.

The piezoelectric vibrating piece 020 is constituted by forming quartz in a tuning fork type and including an exciting electrode (not illustrated) and a mount pad 021 on a surface thereof.

The mount pad 021 of the piezoelectric vibrating piece 020 and the inner lead 012a of the airtight terminal 010 are electrically and mechanically connected. The connection is carried out by locally melting the plating 015 provided at the surface of the inner lead 012a in the atmosphere and connecting the mount pad 021 and the inner lead 012a by the melted plating.

The case 030 is constituted by a shape of a bottomed cylinder opening one end face (lower end face in FIG. 21A) and closing other end face (upper end face in FIG. 21A) and constituted by subjecting a surface of nickel silver (brass Ni alloy) to Ni plating.

The case 030 is constituted by capping an opening end face side of the case 030 to an outer peripheral face of the stem 011 tightly by tight fitting to cover the inner lead 012a and the piezoelectric vibrating piece 020 to be contained to an inner space thereof. At this occasion, the plating 014 constituting a soft metal is subjected to cold pressure welding to realize airtight bonding.

Further, in FIG. 21A the case 030 is illustrated in a transparent state to facilitate understanding by optically recognizing an inner state of the case 030.

A method of automating to fabricate such a piezoelectric vibrator is disclosed (for example, JP-A-8-316761).

Meanwhile, in recent years, rapid downsizing of an electronic part is requested, and according to a fabricating method of a background art, it is very difficult to fabricate a small-sized piezoelectric vibrator with excellent yield at low cost and highly reliably.

There are two principal problems thereof. A first problem is an increase in cost of fabricating an airtight terminal by a reduction in yield in plating at a step of fabricating the airtight terminal. The second problem is a problem of a reduction in a rigidity of an outer lead of an airtight terminal.

A concise description will be given of the two problems as follows.

A significant reduction in yield in plating in accordance with downsizing an airtight terminal constituting the first problem is caused by narrowing an interval between leads and a reduction in a rigidity by reduction in a wire diameter of a lead.

A diameter of a piezoelectric vibrator of a cylinder package type (which is a maximum value of an outer shape of a case after having been sealed and is designated by notation D in FIG. 21A) is reduced from about 3 mm to 2 mm, and becomes 1.5 mm. In recent years, downsizing is further progressed for a piezoelectric vibrator used in a portable telephone and a diameter of 1.2 mm is used. The tendency is further progressed, and a dimension smaller than 1 mm has been investigated to adopt.

By such progress of downsizing, an interval of 2 pieces of leads (designated by notation d1 in FIG. 21A) constituting members of an airtight terminal becomes extremely narrow, further, also a diameter of the lead per se (designated by notation d2 in FIG. 21A) becomes slender, a rigidity thereof is reduced and the lead is liable to be bent easily.

A plating step of a background art is of a barrel plating type advantageous for mass production. A shape of vessel is constituted by a hexagonal column having, for example, a diameter of several tens cm and a length of about 40 cm through 80 cm and is made of resin of acrylic resin or the like. Electric plating is carried out by putting airtight terminals of a number of about 200 thousands through 500 thousands into the vessel and taking several hours while slowly rotating the vessel at inside of a plating tank to agitate the airtight terminals at inside thereof.

In the step, particularly in a case of a small-sized airtight terminal of D=1.2 mm or the like, the lead interval is narrow, the lead per se is liable to be bent easily and therefore, a failure of bridging plating between the leads, or a failure of entwining the outer leads is frequently brought about. Thereby, there poses a problem that yield in plating is considerably reduced, and cost of fabricating the airtight terminal is considerably increased.

The second problem is a reduction in the rigidity of the outer lead of the airtight terminal. Although a reduction in the rigidity of the outer lead has been indicated as the problem also in fabricating the airtight terminal constituting the first problem, here, the second problem is posed as a problem having other aspect which is posed in a step of integrating the piezoelectric vibrating piece. The problem is related to the inner lead in accordance with downsizing the piezoelectric vibrating piece.

When the piezoelectric vibrating piece is further downsized in the future, an area of a mount pad on a piezoelectric vibrating piece is narrowed and a gap between the piezoelectric vibrating piece and the mount pad is reduced. Therefore, it is a problem how to constitute a fine positional relationship between a front end of an inner lead of an airtight terminal bonded to the mount pad and the mount pad. At the same time, an outer lead is aligned and held mechanically in a pallet in an integrating step and therefore, the outer lead needs a rigidity so as not to be bent in the integrating step.

According to the lead of the airtight terminal of the background art, a total of the lead is constituted by a solid round bar having a uniform diameter from an easiness in fabrication. However, when a method of the background art which has been improving an accuracy of positioning the mount pad and the front end of the inner lead by making the diameter of the inner lead in accordance with a reduction in the area of the mount pad of the piezoelectric vibrating piece is assumedly followed, also the diameter of the outer lead is similarly made to be slender and the rigidity becomes deficient. For example, when the lead diameter is constituted by 50 μm in a case of the width of the mount pad of 50 μm, the lead is simply bent to be clearly deficient in the rigidity. According to the airtight terminal of the structure of the background art in which the inner lead and the outer lead are provided with the same diameter, there is a concern of being unable to deal with downsizing sufficiently.

Further, also a piezoelectric vibrator having one piece of a lead has been developed in order to ensure a rigidity of the lead (for example, JP-A-2002-43886). In this case, although the piezoelectric vibrator is formed with two of mount pads, one of the mount pads is electrically and mechanically connected to one piece of the lead and other of the mount pads is electrically and mechanically connected to a stem by way of a conductive member or the like functioning as the lead.

When the lead is constituted by one piece in this way, it is not necessary to take a lead interval into consideration and therefore, downsizing can be achieved by that amount. However, a method of fabricating the airtight terminal constituting the lead by one piece with excellent yield has not been established yet.

In view of the above-described background art, it is an object of the invention to provide an airtight terminal and a piezoelectric vibrator having a strong rigidity of a lead and eliminating a failure in plating even by a small size and a method of fabricating an airtight terminal or a piezoelectric vibrator constituting a lead penetrated at inside of a stem by one piece with excellent yield.

SUMMARY OF THE INVENTION

As described above, according to the airtight terminal and the piezoelectric vibrator of the background art, generally, 2 pieces of the leads comprising round bars made of a metal are penetrated to inside of the stem filled with the filling member.

In contrast thereto, according to an airtight terminal or a piezoelectric vibrator according to the invention, there is constructed a constitution in which only one piece of a lead formed by a lead frame is penetrated to inside of a stem filled with a filling member and other piece of a lead (conductive lead) is extended from the stem. According to the invention, by adopting such a special constitution as a constitution of the airtight terminal or the piezoelectric vibrator constituting a part having 2 terminals, downsizing or promotion of product reliability are achieved.

A constitution of an airtight terminal of the invention resolving the problem is characterized in comprising:

a stem in a cylindrical shape;

one piece of a lead arranged to penetrate inside of the stem and formed from a lead frame;

a filling member filled at inside of the stem for fixing and supporting the lead at inside of the stem; and a conductive lead electrically and mechanically connected to the stem to protrude in a direction the same as a direction of protruding in a direction the same as a direction of protruding an inner lead constituting a portion of the lead protruded from one end face side of the stem.

In this case, the airtight terminal is characterized such that the lead is formed with a filling member positioning portion extended in a direction orthogonal to a longitudinal direction of the lead to position a position of forming the filling member;

such that the conductive lead is integrally formed with the stem;

and such that the conductive lead is constituted by connecting a conductive member to the stem.

Further, a constitution of a piezoelectric vibrator according to the invention is characterized in comprising:

the airtight terminal;

a piezoelectric vibrating piece connected to the inner lead and the conductive lead; and a case of a bottomed cylinder type capped to an outer peripheral face of the stem to cover the inner lead, the conductive lead and the piezoelectric vibrating piece.

In this case, the piezoelectric vibrator is characterized such that the piezoelectric vibrating piece is a tuning fork type quartz crystal vibrating piece;

such that the piezoelectric vibrating piece is a quartz crystal vibrating piece of a thickness sliding vibration mode;

such that the inner lead is connected to one face of the piezoelectric vibrating piece, and the conductive lead is connected to other face of the piezoelectric vibrating piece;

such that both sides in a width direction of the inner lead are formed with stepped differences extended in a longitudinal direction of the inner lead and containing the piezoelectric vibrating piece therebetween;

and such that a position of arranging the lead at inside of the stem is made to be eccentric such that a center line in a thickness direction of the piezoelectric vibrating piece substantially coincides with a center line of the stem.

Further, a constitution of a method of fabricating an airtight terminal of the invention is characterized in a method of fabricating an airtight terminal including a stem in a cylindrical shape, one piece of a lead arranged to penetrate inside of the stem and formed from a lead frame, a filling member filled at inside of the stem for fixing and supporting the lead at inside of the stem, a conductive lead electrically and mechanically connected to the stem to protrude in a direction the same as a direction of protruding an inner lead constituting a portion of the lead projected from one end face side of the stem, the method of comprising:

a lead outer shape forming step of arranging a base portion and a lead forming portion at the lead frame, and forming a plurality of outer shapes of the leads at the lead forming portion at predetermined intervals while connecting at least one ends of the leads to the base portion;

a filling member forming and baking step of filling the filling member to a predetermined position of the lead the outer shape of which is formed and baking the filling member after having been formed;

a stem mounting step of mounting the stem at a surrounding of the baked filling member;

a conductive lead forming step of forming the conductive lead;

a baking step of heating to melt the filling member at inside of the stem to be cooled thereafter and bringing the lead and the stem into close contact with each other by way of the filling member to be fixed thereby;

a metal film forming step of forming metal films on surfaces of the lead, the conductive lead and the stem; and a cutting step of cutting to separate the one end of the lead connected to the base portion.

In this case, the method is characterized such that the conductive lead forming step is a step of forming the conductive lead integrally with the stem, such that the conductive lead forming step is a step of connecting a conductive member to the stem to form the conductive lead;

such that a filling member positioning portion capable of positioning the filling member is further formed at a predetermined position of the lead in the lead outer shape forming step;

such that a position of arranging the lead at inside of the stem is made to be eccentric in the filling member forming and baking step;

and such that a stepped difference for supporting a vibrating piece is provided at the inner lead in the lead outer shape forming step.

Further, a method of fabricating a piezoelectric vibrator of the invention is characterized in comprising:

a mounting step of connecting the inner lead and the conductive lead to a piezoelectric vibrating piece; and a capping step of capping a case of a bottomed cylinder type to an outer peripheral face of the stem to cover the inner lead, the conductive lead and the piezoelectric vibrating piece for the airtight terminal formed by the method.

Further, a constitution of an oscillator of the invention is characterized in connecting the piezoelectric vibrator to an integrated circuit as an oscillation piece.

Further, a constitution of an electronic apparatus of the invention is characterized in connecting the piezoelectric vibrator to a time counting portion to be used thereby.

Further, a constitution of a radio wave timepiece is characterized in connecting the piezoelectric vibrator to a filter portion to be used thereby.

According to the invention, the lead penetrating the stem is formed by the lead frame and is constituted by one piece thereof and therefore, even when the airtight terminal or the piezoelectric vibrator is downsized, a width of the lead can be made to be wide and a rigidity of the lead can be ensured.

Therefore, the lead can be prevented from being bent in a plating step or an integrating step.

Further, the lead frame is formed with a number of the leads, a metal film is formed (by plating) in a state of providing the filling member, the stem, the conductive lead at each of the leads and therefore, there is not brought about a drawback of bridging the leads by plating and product yield is increased.

Further, a number of the airtight terminals can summarizingly be formed from the lead frame and therefore, the number of airtight terminals can efficiently be fabricated.

BRIEF DESCRIPTION OF THE DRAWINGS

FIGS. 2A, 2B and 2C illustrate perspective views disassembling to show a lead and a filling member used in Embodiment 1.

FIGS. 4A and 4B show a modified example of Embodiment 1, in which

FIG. 4A is a view extracting an essential portion thereof, and FIG. 4B is a sectional view taken along a line VI-VI of FIG. 4A.

FIGS. 5A, 5B and 5C show other modified example of Embodiment 1 of the invention, in which FIG. 5A is a view extracting an essential portion thereof, FIG. 5B is a sectional view taken along a line V-V of FIG. 5A, and FIG. 5C is a sectional view showing a comparative example.

FIGS. 8A, 8B and 8C show a lead frame of a strip-like type, in which

FIG. 8A is a plane view, and FIGS. 8B and 8C are plane views extracting to show an essential portion thereof.

FIGS. 11A and 11B show a lead frame and a filing member after having been baked, in which FIG. 11A is a plane view, and FIG. 11B is a sectional view extracting to show an essential portion thereof.

FIGS. 12A and 12B show a lead frame mounted with a stem, in which

FIG. 12A is a plane view and FIG. 12B is a sectional view extracting to show an essential portion thereof.

FIGS. 14A and 14B illustrate views for explaining a metal film forming step, in which FIG. 14A is a plane view, and FIG. 14B is a plane view extracting to show an essential portion thereof.

FIGS. 21A and 21B show a piezoelectric vibrator of a cylinder package type of a background art, in which FIG. 21A is a perspective view of a total thereof, and FIG. 21B is a partial sectional view showing a state of cutting a stem portion along a longitudinal direction of a lead.

DETAILED DESCRIPTION OF THE PREFERRED EMBODIMENTS

The best mode for carrying out the invention will be explained in details based on embodiments as follows.

Embodiment 1

Figure 1:
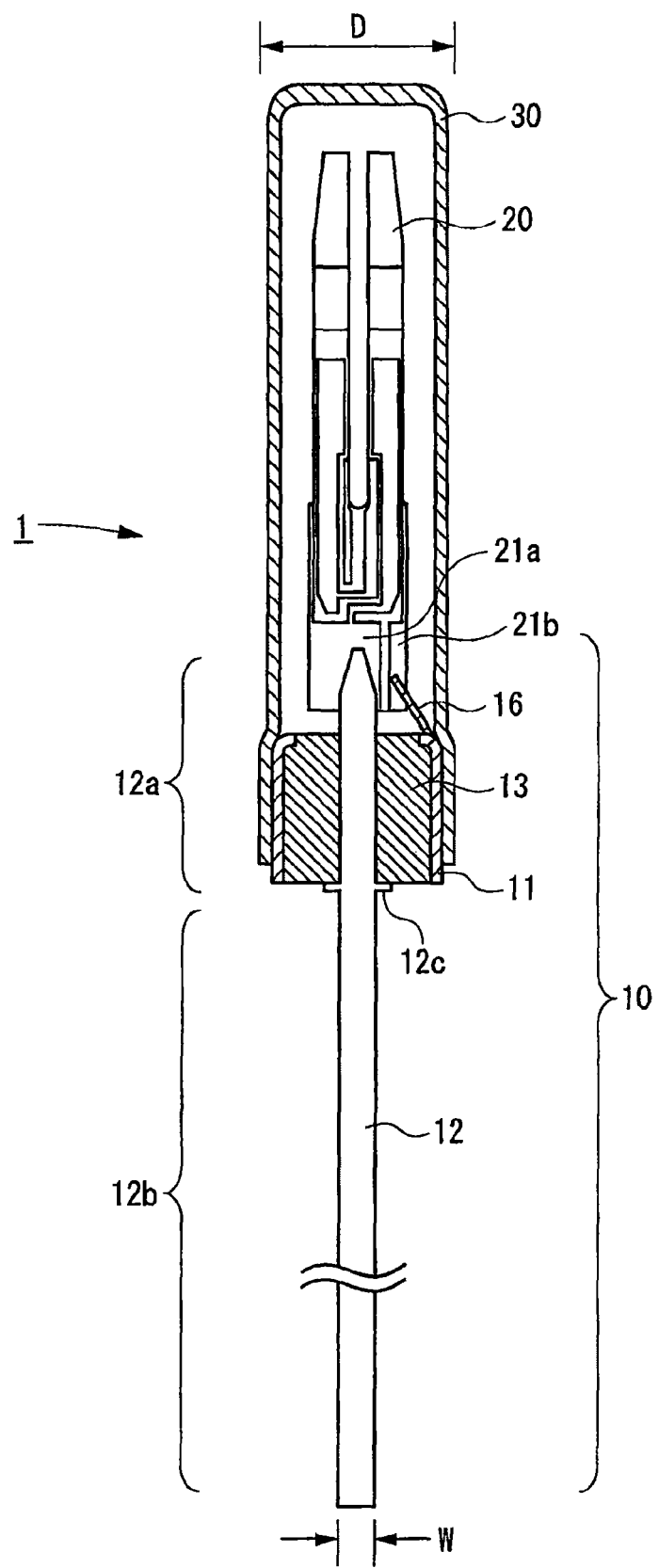
FIG. 1 is a sectional view of a piezoelectric vibrator according to Embodiment 1 of the invention.

Piezoelectric Vibrating Piece Using Tuning Fork Type Quartz Piezoelectric Vibrating Piece FIG. 1 is a sectional view showing a piezoelectric vibrator 1 using a tuning fork type quartz piezoelectric vibrating piece according to Embodiment 1 of the invention. Here, piezoelectric vibrating pieces having vibration modes not only of flexing vibration but also torsional vibration and vibration synthesized with flexing vibration and torsional vibration and the like are included.

The piezoelectric vibrating piece 1 is constituted by an airtight terminal 10, a piezoelectric vibrating piece 20 constituting a tuning fork type quartz piezoelectric vibrating piece, and a case 30 as principal members thereof.

Among the principal members, the airtight terminal 10 is constituted by a stem 11 in a cylindrical shape, one piece of a lead 12 arranged to penetrate inside of the stem 11, a filling member 13 filled at inside of the stem 11 and fixed a lead 12 at inside of the stem 11, and a conductive lead 16 electrically and mechanically connected to the stem 11.

One piece of the lead 12 is formed from a lead frame. The conductive lead 16 extended from the stem 11 is integrally formed with the stem 11, or connected to the stem 11 in the cylindrical shape (attached at a later stage).

According to a method of fabricating the airtight terminal 10, first, a lead frame is formed with a number of the leads 12 although details thereof will be described later. The number of respective leads 12 are provided with a filling material and tentatively baked to form the filling members 13, further, the stems 11 are fitted to a number of the respective filling members 13 (in this case, for example, the stem 11 is integrally formed with the conductive lead 16).

Further, a total of the lead frame brought into a state of providing the filling material 13 and the stems 11 to the leads 12 is baked. Thereby, the airtight terminal 10 integrated with the lead 12 and the filling member 13 and the stem 11 is provided.

Thereafter, a metal film (plating) is provided to the airtight terminal 10 (specifically, surfaces of the lead 12 and the stem 11 and the conductive lead 16). Further, the individual airtight terminals 10 are provided by cutting base ends of the leads 12.

Further, in a case in which the stem 11 is not integrally formed with the lead 16, the lead 16 is connected to the stem 11 after baking the total of the lead frame and before forming the metal film (plating), or the leads 16 are formed when the individual airtight terminals 10 and the piezoelectric vibrating pieces 20 are connected by wire bonding after forming the individual airtight terminals 10 by cutting the base ends of the leads 12.

The stem 11 is formed by, for example, 42 alloy (Fe—Ni) and a surface thereof is subjected to plating having a thickness of about 10 μm through 15 μm. As plating, for example, Cu plating is carried out as a matrix and Sn—Pb plating is carried out thereon as finish plating.

One piece of the lead 12 formed from the lead frame is supported at inside of the stem 11 by way of the filling member 13 in a state of penetrating inside of the stem 11, that is, a state of penetrating the filling member 13 filled at inside of the stem 11.

In other words, the lead 12 is protruded from one end face (end face on upper side in FIG. 1) of the stem 11 and is protruded from other end face (end face on lower side in FIG. 1) of the stem 11 by interposing the stem 11 filled with the filling member 13 at inside thereof.

Generally, a portion protruded from one end face (end face on upper side in FIG. 1) of the stem 11 (portion connected to the piezoelectric vibrating piece 20 and contained in the case 30 as described later) is referred to as "inner lead 12a", and a portion protruded from other end face (end face on lower side in FIG. 1) of the stem 11 (portion which is not contained in the case 30) is referred to as "outer lead 12b".

Further, the lead 12 is formed with a filling member positioning portion 12c extended in a direction orthogonal to a longitudinal direction of the lead 12. Owing to presence of the filling member positioning portion 12c, the filling member 13 can be formed accurately at a rectified position.

The conductive lead 16 is integrally formed with the stem 11, or connected to the stem 11 in the cylindrical shape (attached at later stage). That is, the conductive lead 16 is integrally formed with the stem 16 when the stem 16 in a cylindrical shape is formed (formed by deep drawing or formed by sheet metal punching) or a slender conductive member (wire member) is connected thereto by wiring bonding technology, or a slender conductive member is electrically and mechanically connected to the stem 11 by carrying out spot welding.

Further, the conductive lead 16 is protruded from the side of the one end face of the stem 11. That is, the conductive lead 16 is protruded in a direction the same as a direction of protruding the inner lead 12a. The conductive lead 16 is inclined to a direction of a center axis of the stem 11 and becomes proximate to the inner lead 12a as proceeding to a front end thereof.

FIGS. 2A, 2B and 2C disassemble to show the lead 12 of the airtight terminal 10, the filling member 13, the stem 11 connected with the conductive lead 16.

According to an example of FIG. 2A, the conductive lead 16 is constituted by connecting a slender conductive member (wire member) to the stem 11 by wire bonding technology. The conductive lead 16 is formed by connecting the stem 11 of the airtight terminal 10 and a mount pad 21b of the piezoelectric vibrating piece 20 (wire bonding) after forming the airtight terminal 10 (after having been cut to separate from the lead frame). Therefore, a single member of the airtight terminal 10 is not connected with the conductive lead 16 and therefore, the conductive lead 16 is illustrated by an imaginary line. Further, the connection can smoothly be carried out when a portion of the stem 11 fitted to the conductive lead 16 by a slender conductive member (wire member) is previously subjected to partial Ag (silver) plating or partial Au (gold) plating or the like.

According to an example of FIG. 2B, the conductive lead 16 is integrally formed with the stem 11 in the cylindrical shape when the stem 11 in the cylindrical shape is formed (formed by deep drawing or formed by sheet metal punching).

According to an example of FIG. 2C, the conductive lead 16 is constituted by welding a slender conductive member to the stem 11 by a spot welding.

Referring back to FIG. 1 and continuing the explanation, surfaces of the lead 12 (including both of the inner lead 12a and the outer lead 12b) and the conductive lead 16 are subjected to plating having a thickness of about 10 μm 15 μm. At the plating, for example, Cu plating is carried out as a matrix and Sn—Pb plating is carried out thereon as finish plating.

The filling member 13 is formed by, for example, borosilicate glass, a thermal expansion rate thereof is made to be substantially equal to those of the stem 11 and the lead 12. The filling member 13 is filled in a space at inside of the stem 11 and supports the lead 12.

The piezoelectric vibrating piece 20 is constituted by forming quartz in a tuning fork type and provided with an exciting electrode and mounting pads 21a, 21b at a surface thereof. According to the example, the mount pad 21a on one side is formed to be wide and the mount pad 21b on other side is formed to be narrow.

The mount pad 21a on one side is electrically and mechanically connected with the inner lead 12a and the mount pad 21b on other side is electrically and mechanically connected with the conductive lead 16. The connection is carried out by locally melting plating provided to surfaces of the inner lead 12a and the conductive lead 16 in the atmosphere, connecting the mount pad 21a and the inner lead 12a and connecting the mount pad 21b and the conductive lead 16 by the melted plating.

In this case, the inner lead 12a having a width wider than that of the conductive lead 16 is connected to the wide mount pad 21a and therefore, the airtight terminal 10 and the piezoelectric vibrating piece 20 are mechanically fixed to be supported mainly by the inner lead 12a and the mount pad 21a.

The case 30 is constituted by a shape of a bottomed cylinder one end face (lower end face in FIG. 1) of which is opened and other end face (upper end face in FIG. 1) of which is closed, and is constituted by subjecting a surface thereof of silver nickel (brass Ni alloy) to Ni plating.

According to the case 30, the side of the opening end face of the case 30 is capped to an outer peripheral face of the stem 11 tightly by tight fitting in vacuum to cover the inner lead 12a, the conductive lead 16 and the piezoelectric vibrating piece 20 to be contained in an inner space. At this occasion, the plating constituting a soft metal provided to the stem 11 is subjected to cold pressure welding to realize airtight bonding.

The piezoelectric vibrator 1 of the embodiment is constructed by a constitution of penetrating only one piece of the lead 12 through the stem 11. Therefore, even when a diameter D of the piezoelectric vibrator 1 becomes small, a width W of the lead 12 can be widened.

Although when a constitution of penetrating 2 pieces of the leads through the stem 11 is assumedly constructed, a width per one piece of the lead is narrowed, according to the embodiment, only one piece of the lead 12 is penetrated therethrough and therefore, the width of the lead 12 can be adopted to be wide.

Since the width of the lead 12 is widened in this way, a rigidity of the lead 12 can be increased. Further, since the rigidity of the lead 12 is increased, there is not brought about a drawback that the lead 12 is bent in an integrating step.

Further, the metal film (plating) is provided to the lead 12 formed at the lead frame in a state of including the filling member 13, the stem 11 and the conductive lead 16 and therefore, a failure in accordance with the plating is hardly brought about. That is, in the plating operation, the leads 12 are not entwined by each other.

Further, an interval between the leads 12 contiguous to each other is maintained, one piece of the lead is provided to one of the piezoelectric vibrating piece and therefore, in contrast to a constitution of providing 2 pieces of the leads to one of the piezoelectric vibrating piece, the interval between the contiguous leads 12 formed at the lead frame is widened, and a failure of bridging plating between the leads 12 is difficult to be brought about.

Further, the lead 12 formed at the lead frame is provided with the filling member 13, the stem 11 and the conductive lead 16 and the metal film (plating) is provided thereto under the state and therefore, that is, by simultaneously carrying out respective steps necessary for fabrication successively to a number of the leads formed at one of the lead frame, a number of the airtight terminals 10 can summarizingly be formed from one of the lead frame and therefore, the number of airtight terminals 10 can efficiently be fabricated.

When the diameter D of the piezoelectric vibrator 1 becomes smaller, the width of the inner lead 12a is narrowed while making the width of the outer lead 12b of the lead 12 stays to be wide. Thereby, further downsizing of the piezoelectric vibrator 1 can be achieved and the rigidity can be ensured by maintaining a state of the wide width of the outer lead 12b.

Embodiment 2

Piezoelectric Vibrator Using at Type Quartz Piezoelectric Vibrating Piece

Figure 3:
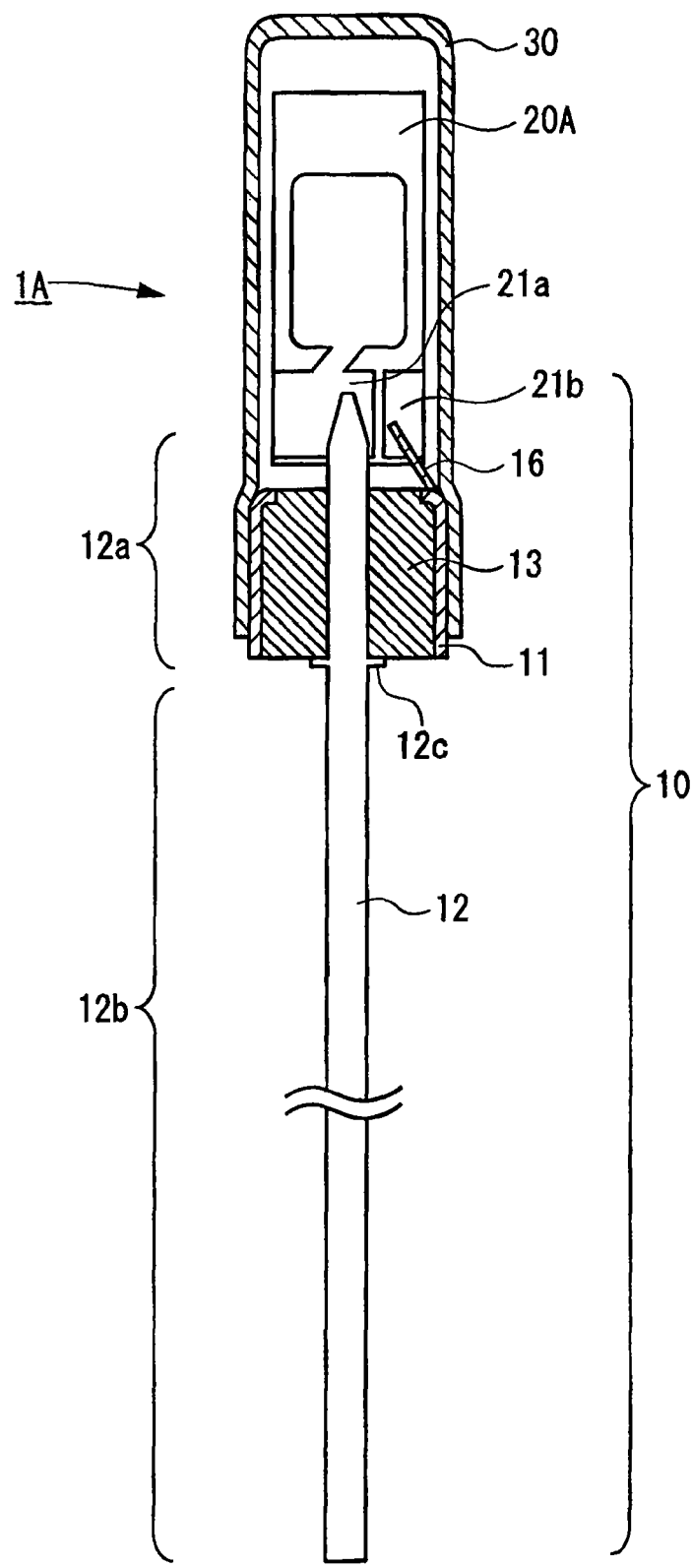
FIG. 3 is a sectional view showing a piezoelectric vibrator according to Embodiment 2 of the invention.

FIG. 3 is a sectional view showing a piezoelectric vibrator 1A using an AT type quartz piezoelectric vibrating piece according to the Embodiment 2. Further, a piezoelectric vibrating piece of a BT type of a thickness sliding vibration mode the same as that of the AT type is also applicable similarly.

According to the piezoelectric vibrator 1A, a piezoelectric vibrating piece 20A constituting the AT type quartz piezoelectric vibrating piece is used. Constitutions of other portions are similar to those of Embodiment 1 shown in FIG. 1. Further, also a fabricating procedure thereof stays the same.

In this way, although members other than the piezoelectric vibrating piece 20A partially differ from those shown in FIG. 1 in dimensions and shapes, functions thereof stay the same. Further, also a fabricating procedure thereof stays the same. Therefore, members achieving the same functions are attached with the same notations and a detailed explanation thereof will be omitted.

Also in the piezoelectric vibrator 1A, an effect similar to that of the piezoelectric vibrator 1 shown in FIG. 1 can be achieved.

Embodiment 3

Modified Example 1 of Embodiment 1

Figure 4A:
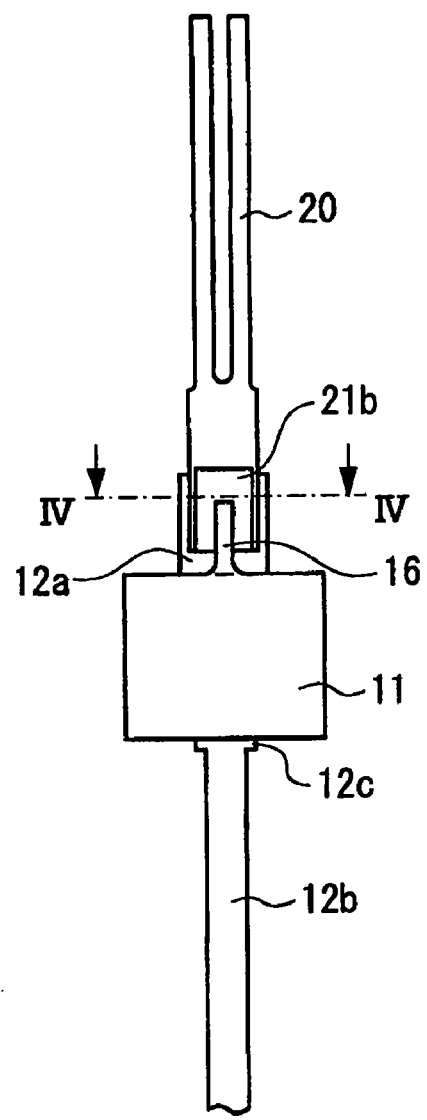
Figure 4B:
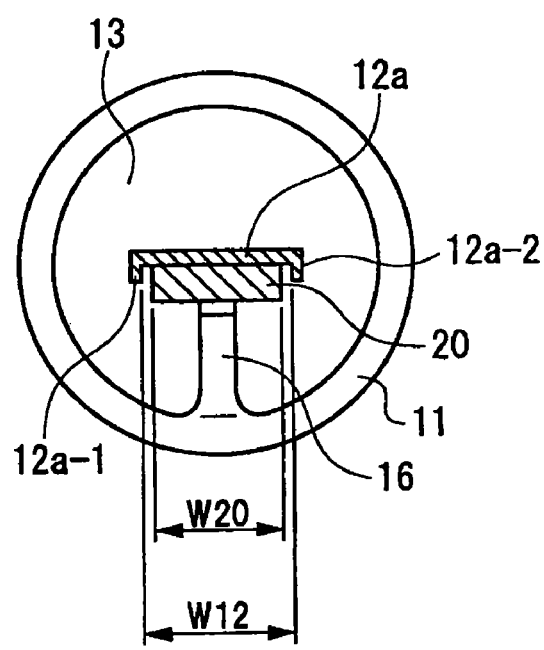

Next, Modified Example 1 of the piezoelectric vibrator 1 shown in Embodiment 1 will be explained in reference to FIG. 4A extracting to show an essential portion thereof, and FIG. 4B showing a section taken along a line IV-IV of FIG. 4A.

As shown by FIGS. 4A and 4B, according to Modified Example 1, the mount pad 21b is formed on a surface side (top side of paper face shown in FIG. 4A) of the piezoelectric vibrating piece 20 and the mount pad 21a is formed on a back face side thereof (tail side of paper face shown in FIG. 4A) (brought into a state of being unable to be optically recognized in FIG. 4A). Further, the inner lead 12a is connected to the mount pad 21a on the back face side and the conductive lead 16 is connected to the mount pad 21b on the surface side.

In a case in which the piezoelectric vibrating piece 20 becomes extremely small-sized, when two of the mount pads are intended to form on one face, areas of forming the respective mount pads are extremely contracted. However, by forming the respective mount pads dividingly to the surface and the rear face of the piezoelectric vibrating piece 20 as in Modified Example 1, even in a case of the extremely small-sized piezoelectric vibrating piece 20, the mount pads 21a, 21b having sufficient areas can be constituted. As a result, connection of the inner lead 12a and the mount pad 21a and connection of the conductive lead 16 and the mount pad 21b can firmly be carried out.

Further, both sides in a width direction of the inner lead 12a are formed with stepped differences 12a-1, 12a-2 for positioning to extend in a longitudinal direction of the inner lead 12a. Further, there is constructed a constitution of containing the base portion of the piezoelectric vibrating piece 20 between 2 pieces of the stepped differences 12a-1, 12a-2 formed at the inner lead 12a. That is, both sides in a width direction of the piezoelectric vibrating piece 20 are positioned by the stepped differences 12a-1, 12a-2 and the piezoelectric vibrating piece 20 and the inner lead 12a are connected in the positioned state.

In this case, a width W12 formed between the stepped differences 12a-1, 12a-2 is made to be wider than a width W20 of the piezoelectric vibrator 20 slightly (for example, about 20 μm).

Since the stepped differences 12a-1, 12a-2 extended in the longitudinal direction of the inner lead 12a are formed in this way, even when the piezoelectric vibrating piece 20 becomes extremely small-sized, the piezoelectric vibrating piece 20 can be attached to the inner lead 12a by being positioned to a rectified position between the stepped differences 12a-1, 12a-2 by an automatic integrating machine.

Embodiment 4

Modified Example 2 of Embodiment 1

Figure 5A:
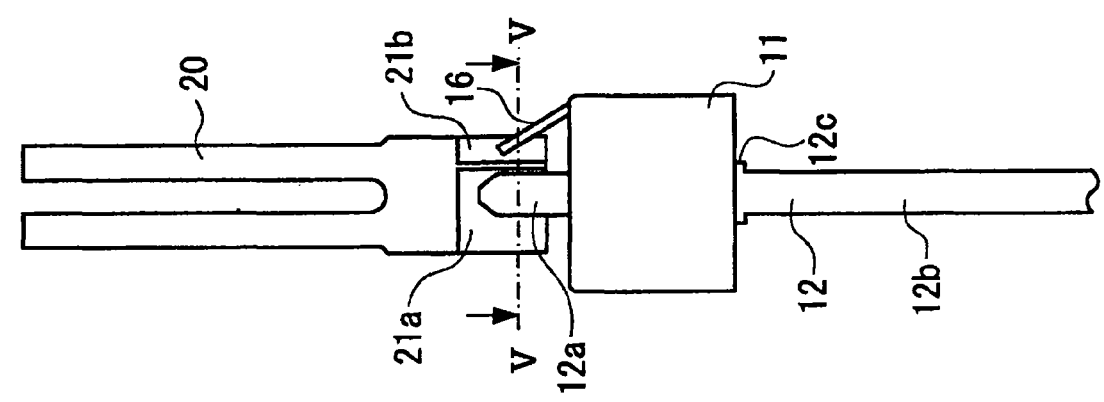
Figure 5B:
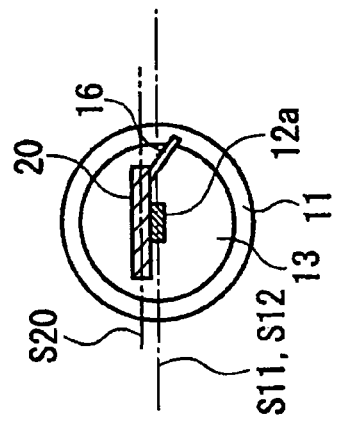
Figure 5C:
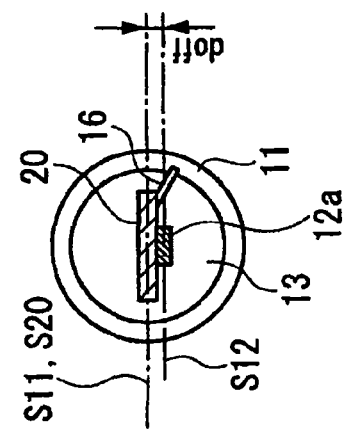

Next, Modified Example 2 constituting other modified example of the piezoelectric vibrator 1 shown in Embodiment 1 will be explained in reference to FIG. 5A extracting to show an essential portion thereof and FIG. 5B showing a section taken along a line V-V of FIG. 5A. Further, FIG. 5C shows a general arrangement constitution shown as a comparative example.

As shown by FIGS. 5A and 5B, Embodiment 2 is an example of arranging the lead 12 eccentrically (offset) to a center line S11 of the stem 11 in a ring-like shape.

In a background art, it is known that in mounting the piezoelectric vibrating piece 20 to the inner lead 12a, when the inner lead 12a is assumedly bent (inclined), there is a case of bringing about a failure in oscillation by constituting an electrically shortcircuited state by bringing a front end of a vibrating arm of the piezoelectric vibrating piece 20 bonded thereto into contact with an inner face of the case 30 made of a metal.

As shown by FIG. 5B, when a position of arranging the lead 12 (inner lead 12a) at inside of the stem 11 is previously made to be eccentric such that a center line S20 in a thickness direction of the piezoelectric vibrating piece 20 substantially coincides with the center line S11 of the stem 11, an interval between the front end of the vibrating arm and the inner face of the case 30 made of a metal stays substantially equal at top and tail of the vibrating arm. Therefore, even when the inner lead 12a is similarly bent, a possibility of bringing the front end of the vibrating arm of the piezoelectric vibrating piece 20 mounted thereto into contact with the inner face of the case 10 made of a metal can be reduced.

FIG. 5C shows a general situation of mounting the inner lead 12a and the piezoelectric vibrating piece 20. The center line S12 in a plate thickness direction of the inner lead 12a substantially coincides with the center line S11 of the ring-like stem 11. The piezoelectric vibrating piece 20 is disposed on an upper side of the center line S11 of the stem 11 in the drawing.

FIG. 5B shows an example of making the inner lead 12a eccentric. An amount of the offset is designated by notation doff. A value of doff is determined in consideration of the thickness of the piezoelectric vibrating piece 20 connected thereto. For example, when the thickness of the piezoelectric vibrating piece 20 is 70 μm and the plate thickness of the inner lead 12a is 100 μm, doff=(70/2)+(100/2)=85 μm. By setting such an amount of the offset, the center line S20 in the thickness direction of the piezoelectric vibrating piece 20 can be made to substantially coincide with the center line S11 of the ring-like stem 11. A possibility of bringing the front end of the vibrating arm of the piezoelectric vibrating piece 20 mounted thereto into contact with the inner face of the case 30 made of a metal is reduced to achieve an effect of reducing a failure in oscillation.

Embodiment 5

Method of Fabricating Airtight Terminal

A method of fabricating an airtight terminal will be explained as Embodiment 5 of the invention.

As an electrically conductive material constituting the lead and the stem, low carbon steel (Fe), iron nickel alloy (Fe—Ni), iron nickel cobalt alloy (Fe—Ni—Co) or the like is used. Further, as the filling member, soda-lime glass, soda-barium glass, or borosilicate glass or the like is used.

Figure 6:
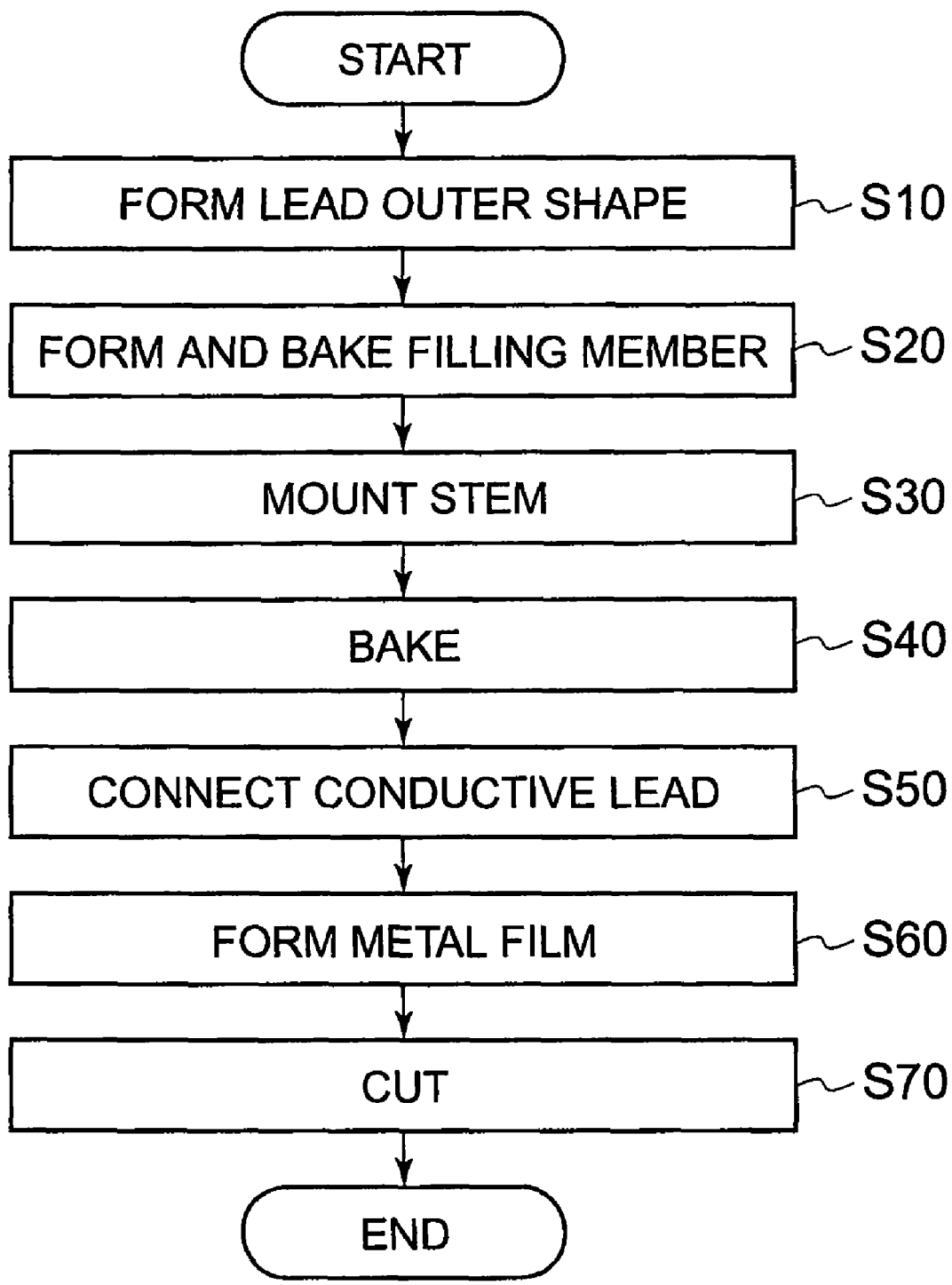
FIG. 6 is a flowchart showing a method of fabricating an airtight terminal.

FIG. 6 is a flowchart showing an outline of an example of steps of fabricating an airtight terminal according to the invention. As shown by FIG. 6, an airtight terminal is substantially fabricated by the following procedure (further, detailed fabricating steps will be described later).

(1) First, a plurality of outer shapes of leads are formed at a lead forming portion while arranging a base portion and the lead forming portion at a plate-like or a strip-like electrically conductive material (lead frame LF) and connecting one ends of the leads to the base portion (lead outer shape forming step: step 10).

(2) A filling member is filled at predetermined positions of the plurality of leads the outer shapes of which are formed while connecting the one ends of the leads to the base portion, and the filling member is formed and thereafter baked (filling member forming and baking step: 20).

(3) A stem is mounted to a surrounding of the baked filling member while connecting the one end of the lead to the base portion (stem mounting step: step 30).

(4) The lead and the stem are brought into close contact with each other to be fixed by baking by way of the filling member while connecting the one end of the lead to the base portion (baking step: step 40).

(5) A step of connecting the conductive lead to the stem (conductive lead connecting step: step 45). That is, as shown by FIG. 2C, the step is a step of connecting the conductive lead to the stem by spot welding. Further, when the conductive lead is formed by wire bonding as shown by FIG. 2A, the conductive lead is formed when the airtight terminal finished with a cutting step and the piezoelectric vibrating piece are bonded by wire bonding. Further, when the conductive lead is integrally formed with the stem as shown by FIG. 2B, the connecting step of step 45 is not needed.

(6) A metal film is formed on a surface of the lead while connecting the one end of the lead to the base portion (metal film forming step: step 50).

(7) Finally, one end connected to the base portion of the lead is cut to be separated (cutting step: step 60).

Figure 7:
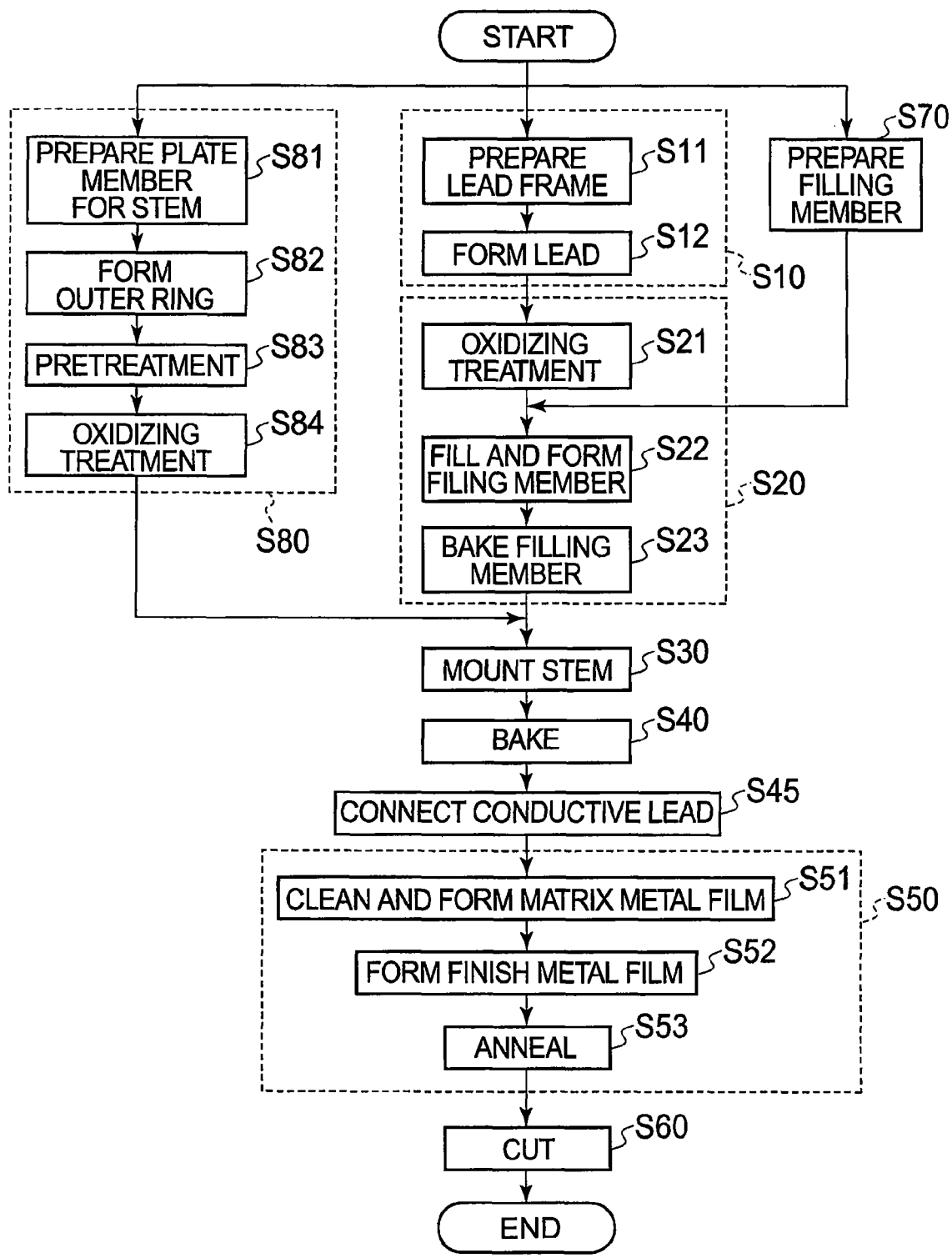
FIG. 7 is a flowchart showing details of the method of fabricating the airtight terminal.

The above-described respective fabricating steps will be explained in details in reference to FIG. 7 through FIG. 15 as follows. FIG. 7 is a flowchart showing details by further subdividing the outline steps of fabricating the airtight terminal shown in FIG. 6. FIG. 8 through FIG. 15 are explanatory views for explaining the respective steps.

[Lead Outer Shape Forming Step (Step 10)]

According to the lead outer shape forming step (step 10), first, the lead frame LF comprising the above-described material and having a pertinent thickness is prepared (step 11). The lead frame is prepared by a mode in a strip-like shape or a hoop-like shape or a plate-like shape.

Figure 8A:
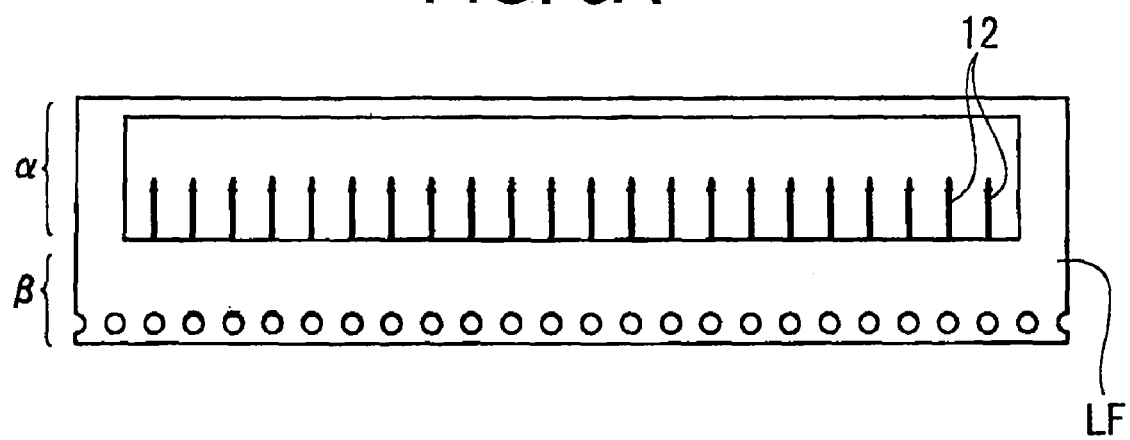
Figure 9:
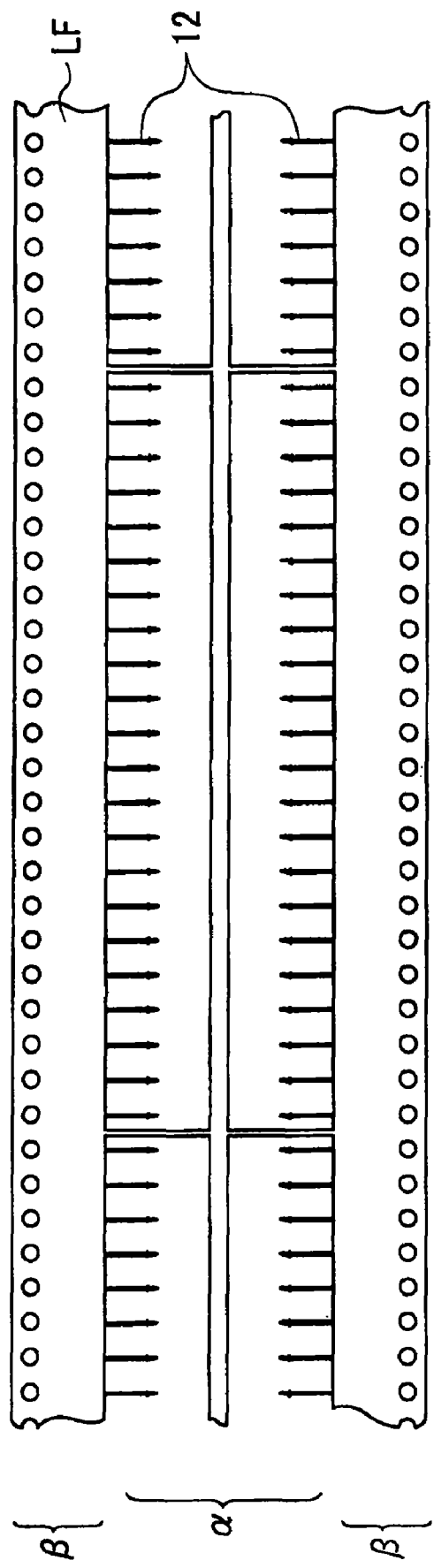
FIG. 9 is a plane view showing a lead frame in a hoop-like shape.
Figure 10:
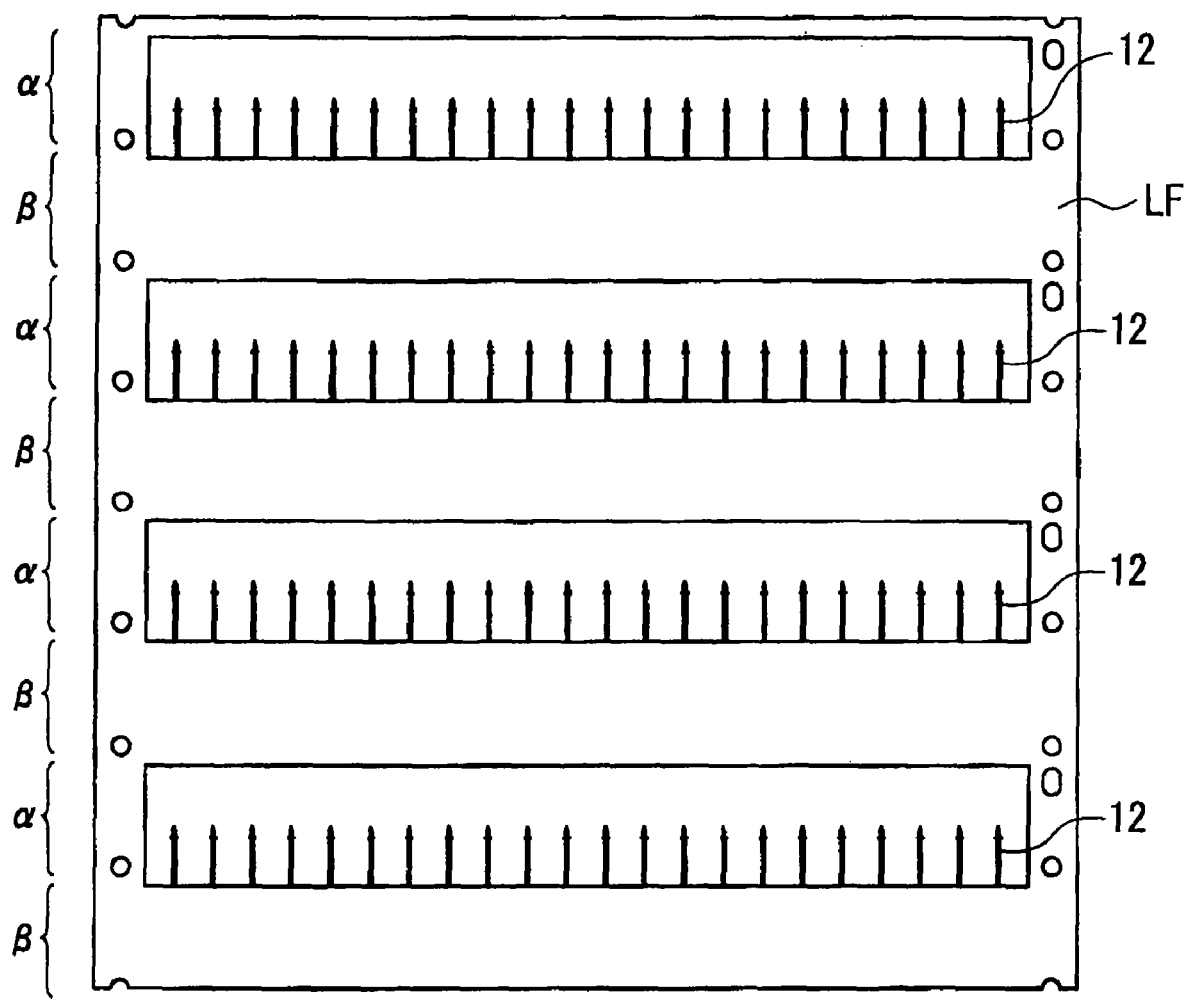
FIG. 10 is a plane view showing a lead frame in a plate-like shape.

FIG. 8A shows a lead frame LF in a standard type (strip-like shape), FIG. 9 shows a lead frame LF in a hoop-like shape, and FIG. 10 shows a lead frame LF in a plate-like shape formed with a plurality of the lead frames in the standard type in a vertical direction, which is designed to intend to promote productivity.

Next, a lead forming portion α (portion in a rectangular shape extending a range of a in a longitudinal direction in FIGS. 8 through 10) for forming a plurality of leads and a base portion β (portion in a rectangular shape extending a range of P in a longitudinal direction in FIGS. 8 through 10) to be contiguous to the lead forming portion α are respectively arranged at predetermined positions of the lead frame LF.

Figure 8B:
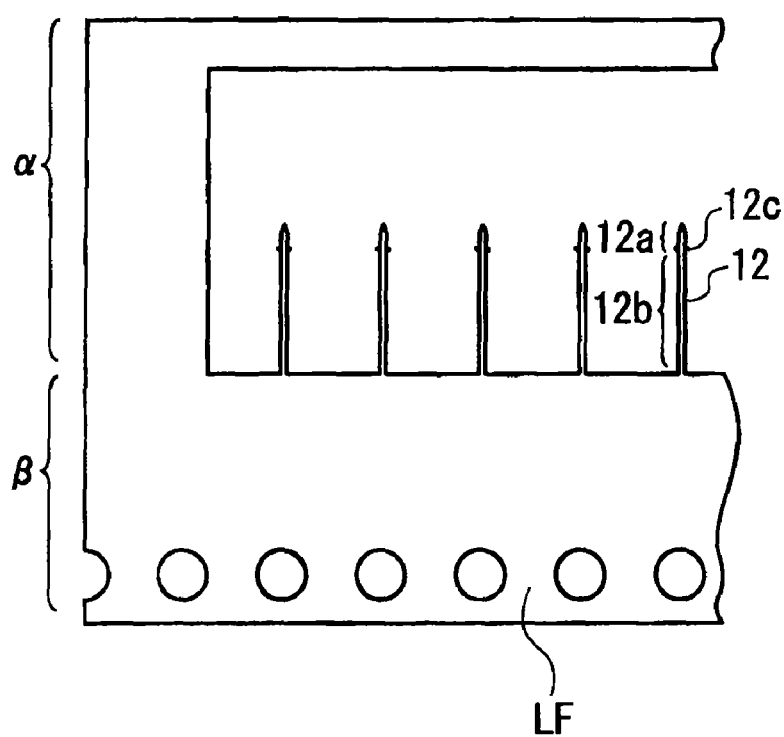
Figure 8C:
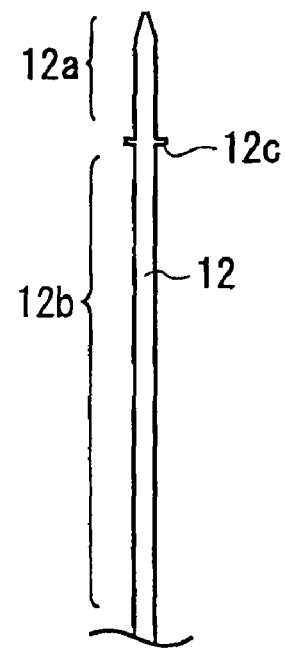

Further, FIGS. 8B and 8C extract to show an essential portion of the lead frame LF of the standard type shown in FIG. 8A.

Although in the following explanation, the explanation will be continued by taking an example of a case of using the lead frame LF of the standard type, an operational procedure stays the same even in the lead frame LF in the hoop-like shape or the plate-like shape shown in FIG. 9 and FIG. 10.

The lead forming portion α of the lead frame LF is subjected to pressing, laser machining, or chemical machining of etching or the like to form an outer shape of the lead 12 in a state of connecting one end of the lead 12 to the base portion β (step 12).

By the machining, the lead forming portion α of the lead frame LF is brought into a mode of aligning a plurality of the leads 12 staying to be connected to the base portion β at constant intervals.

Further, the outer lead 12*b* is provided with the filling member positioning portion 12*c* for positioning the filling member filled and formed at a later step. The filling member positioning portion 12*c* can be formed also by a method other than pressing, laser machining, or chemical machining of etching or the like. For example, an outer side of the outer lead 12*b* can be provided with a slender member separately from the outer lead 12*b* and the filling member positioning portion 12*c* can be provided at a front end thereof. Furthermore, the outer lead 12*b* can be prevented from being bent in the steps of fabricating the airtight terminal by providing strength by making a width thereof wider than that of the inner lead 12*a*.

Although according to the embodiment, the lead 12 is formed to constitute a state of connecting the one end of the outer lead 12*b* to the base portion β of the lead frame LF, the lead 12 may be formed to constitute a state of connecting one end of the inner lead 12*a* to the base portion β. However, a size of the inner lead 12*a* is restricted and therefore, it is important to pay attention to a strength of a portion thereof connected to the base portion β.

[Filling Member Forming and Baking Step (Step 20)]

In a filling member forming and baking step (step 20), first, the lead frame LF subjected to the above-described machining is subjected to an oxidizing treatment to promote adherence with the filling member formed at a later step (step 21).

Successively, the filling member is filled and formed.

First, a raw material of the filling member (for example, borosilicate glass powder) is prepared (step 70).

Next, a die is prepared and the raw material of the filling member is filled to predetermined positions of the plurality of the leads 12. Thereafter, the filling member 13 is pressed to be formed (step 22).

Successively, the filling member 13 is baked by carrying out tentative baking in a temperature atmosphere around 750° C. (step 23). At this stage, a clearance stays to be provided between the filling member and the lead 12 yet.

FIGS. 11A and 11B show a state after baking. The filling member 13 is arranged at a predetermined position on the lead 12 by the filling member positioning portion 12*c* as described above.

[Stem Mounting Step (Step 30)]

The next step is a stem mounting step. The stem 11 fabricated by steps separately from the steps of machining the lead frame LF is brought from the open end side of the inner lead 12*a* to be mounted to an outer side of the baked filling member 13 (step 30).

Here, other step (step 80) for fabricating the step will be described. First, a plate member for the stem is prepared (step 81). As a material, as described above, low carbon steel, iron nickel alloy, iron nickel cobalt alloy or the like is used.

A number of pieces of the plate members are simultaneously punched by a press (step 82). Successively, a pretreatment of acid cleaning, deoxidizing or the like is carried out (step 83). Next, an oxidizing treatment is carried out for promoting adherence with the filling member 13 (step 84).

The stem 11 fabricated by such steps is mounted to the outer side of the filling member 13. FIGS. 12A and 12B show a state of mounting the stem 11.

[Baking Step (Step 40)]

The next step is a step of baking the filling member (step 40). The baking is carried out in accordance with a predetermined temperature pattern of melting the filling member 13 to cool to room temperature. Thereby, an interval between the filling member 13 and the lead 12 and an interval between the filling member 13 and the stem 11 are completely sealed to constitute a structure withstanding airtightness.

Figure 13:
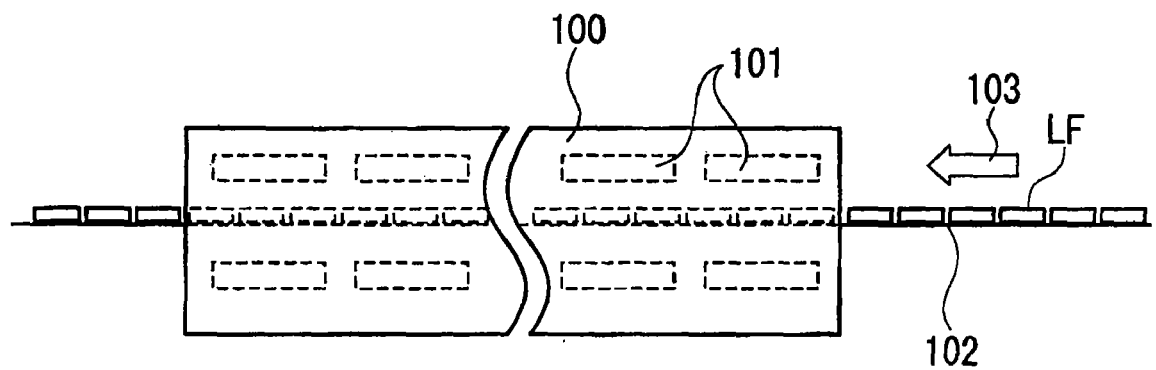
FIG. 13 is a schematic view explaining a baking step.

FIG. 13 is a schematic view for explaining the baking step. The lead frame LF mounted with the stem 11 is moved in a direction of an arrow mark 103 by a predetermined small speed by carrying means 102 to be baked at inside of an electric furnace 100 having a long distance a temperature of which is set to around 1000° C. by using heating means 101.

[Conductive Lead Connecting Step (Step 45)]

The next is the conductive lead connecting step (step 45). In the step, as shown by FIG. 2C, the conductive lead 16 is connected to the stem 11 by spot welding.

Further, when the conductive lead 16 is formed by wire bonding as shown by FIG. 2A, the conductive lead 16 is formed when the airtight terminal finished with the cutting step and the piezoelectric vibrating piece are bonded by wire bonding.

Further, when the conductive lead 16 is formed integrally with the step 11 as shown by FIG. 2B, the connecting step of steps 45 is not needed.

[Metal Film Forming Step (Step 50)]

The next is the metal film forming step (step 50). The metal film forming step is a step of forming a metal film on the surface of the lead 12, the outer peripheral face of the stem 1, and the surface of the conductive lead 16.

In the film metal forming step, a description will be given of a case of attaching the films of the same material on the surface of the lead 12, the outer periphery of the stem 1, and the surface of the conductive lead 16 by a wet plating method.

Prior to a plating step, a pretreatment is carried out. That is, after cleaning the surface of the filling member 13, a total thereof is degreased by an alkaline solution and is cleaned by an acid by a solution of hydrochrolic acid and hydrosulpheric acid.

Next, Cu plating or Ni plating constituting plating of a matrix is attached by a thickness of about 2 μm through 5 μm (step 51).

Successively, as finish plating, any one of plating materials of tin lead alloy (Sn—Pb), tin bismuth alloy (Sn—Bi), tin antimony alloy (Sn—Sb), tin copper alloy (Sn—Cu) other than single materials of tin (Sn), silver (Ag) and the like and methods of carrying out Ag plating further after tin copper alloy plating are selected to attach the plating by a film thickness of about 8 μm through 15 μm (step 52).

The film by the plating materials is formed on the surface of the lead 12, the outer peripheral face of the stem 11, and the surface of the conductive lead 16. Thereby, the inner lead 12a and the piezoelectric vibrator 20 can be connected by plating and the conductive lead 16 and the piezoelectric vibrator 20 can be connected by plating, further, by a characteristic of the metal film (plating layer) of the outer peripheral face of the stem 11 of being elastically deformed softly, the stem 11 and the case 30 can be subjected to cold pressure welding to be able to constitute airtight bonding.

In a case of flowing by the mode of the lead frame LF of the strip-like shape of FIG. 8 or the plate-like shape of FIG. 10, baskets hanging the lead frames LF at constant intervals are brought into a plating tank and electricity is conducted and plating is carried out by moving the baskets in the plating tank.

On the other hand, in a case of flowing by the mode of the lead frame LF in the hoop-like shape of FIG. 9, the plating film is formed by moving the lead frame LF in the hoop-like shape by a constant speed at inside of a plating tank. In the case of the hoop-like shape type, the lead frame LF can be made to flow in the state of the hoop integrally over a total of the pretreatment and the plating step and automation is facilitated.

According to the invention, there is constructed a constitution in which the outer leads 12b are connected to the base portion β of the lead frame LF at constant intervals and the contiguous airtight terminals are not brought into contact with each other as already shown by FIGS. 8 through 10. Therefore, there is not brought about a failure of entwining the leads at all.

Successively, in order to stabilize the plating film, the plating film is annealed at inside of a furnace in a vacuum atmosphere (step 53). When an example of a condition of annealing is shown, in a case of the plating material of tin copper alloy (Sn—Cu), a heating temperature is 170° C. and heating time is about one hour.

Figure 14A:
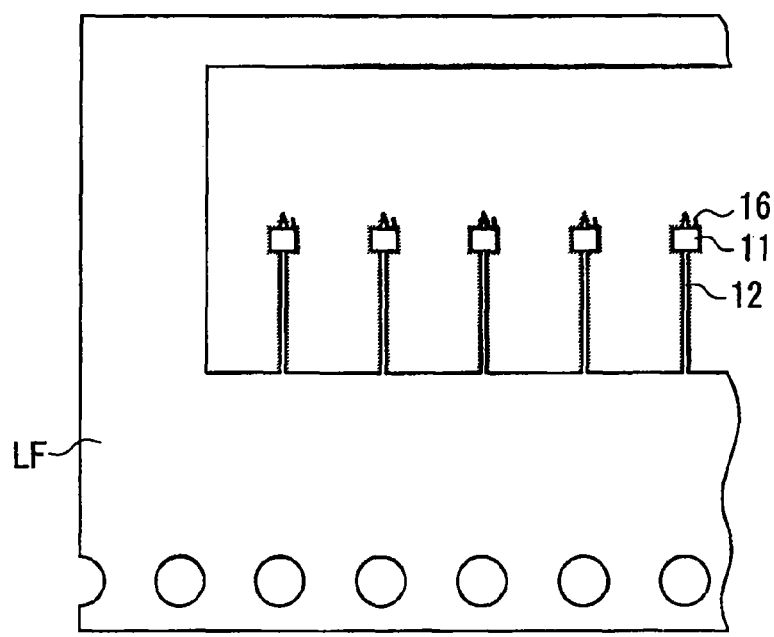
Figure 14B:
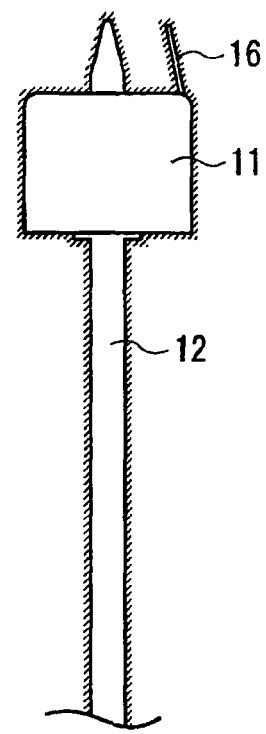

FIGS. 14A and 14B are views for explaining the metal form forming step. Predetermined metal films (plating films) are formed on the surface of the inner lead 12a, the outer peripheral face of the stem 11, and the surfaces of the outer lead 12b and the conductive lead 16. FIGS. 14A and 14B show portions of the plating films by hatching.

A description has been given here of forming the metal film by using the wet plating. Although according to the invention, it is shown that a reduction in plating yield of the airtight terminal brought in accordance with downsizing can be resolved, the method of forming the metal film is not limited only to the wet plating. Other method of forming the metal film may be used, for example, a physical film forming method such as vapor deposition method, or a chemical vapor phase process can be also be selected. Further, different metal films may be formed on the outer peripheral face of the stem and the surfaces of the lead and the conductive lead.

[Cutting Step (Step 60)]

The next step is the cutting step. The step is a step of cutting portions of connecting the outer leads 12b of the airtight terminals and the base portion β of the lead frame LF to separate the individual airtight terminals.

Figure 15:
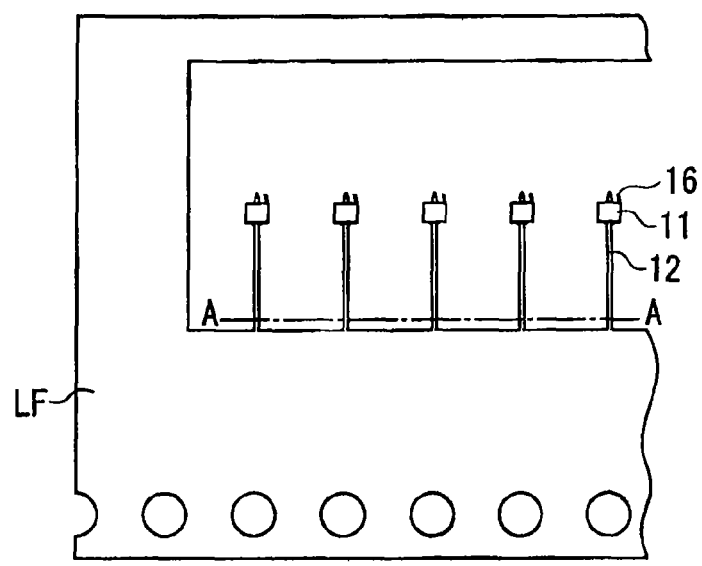
FIG. 15 is a plane view for explaining a cutting step.

FIG. 15 is a view for explaining the cutting step, and cutting and separating are carried out along an imaginary line designated by A-A to constitute the individual airtight terminals 10 (refer to FIG. 1 and FIG. 3). Further, the cut portion may be devised to previously provide a notch, a groove or the like to facilitate cutting although not illustrated.

Embodiment 6

Fabricating Step of Piezoelectric Vibrator

Figure 16:
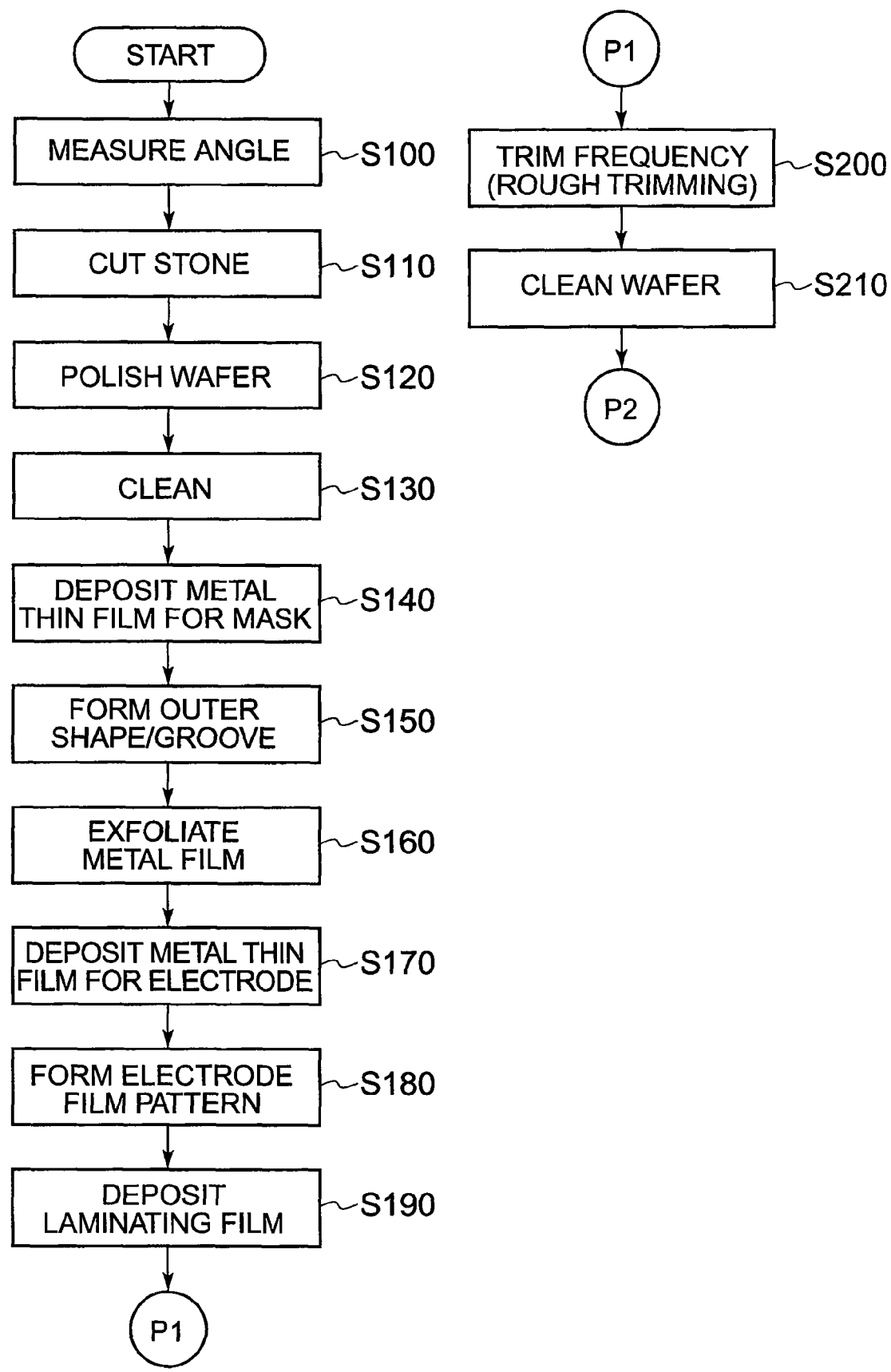
FIG. 16 is a flowchart showing steps of fabricating a piezoelectric vibrating piece.
Figure 17:
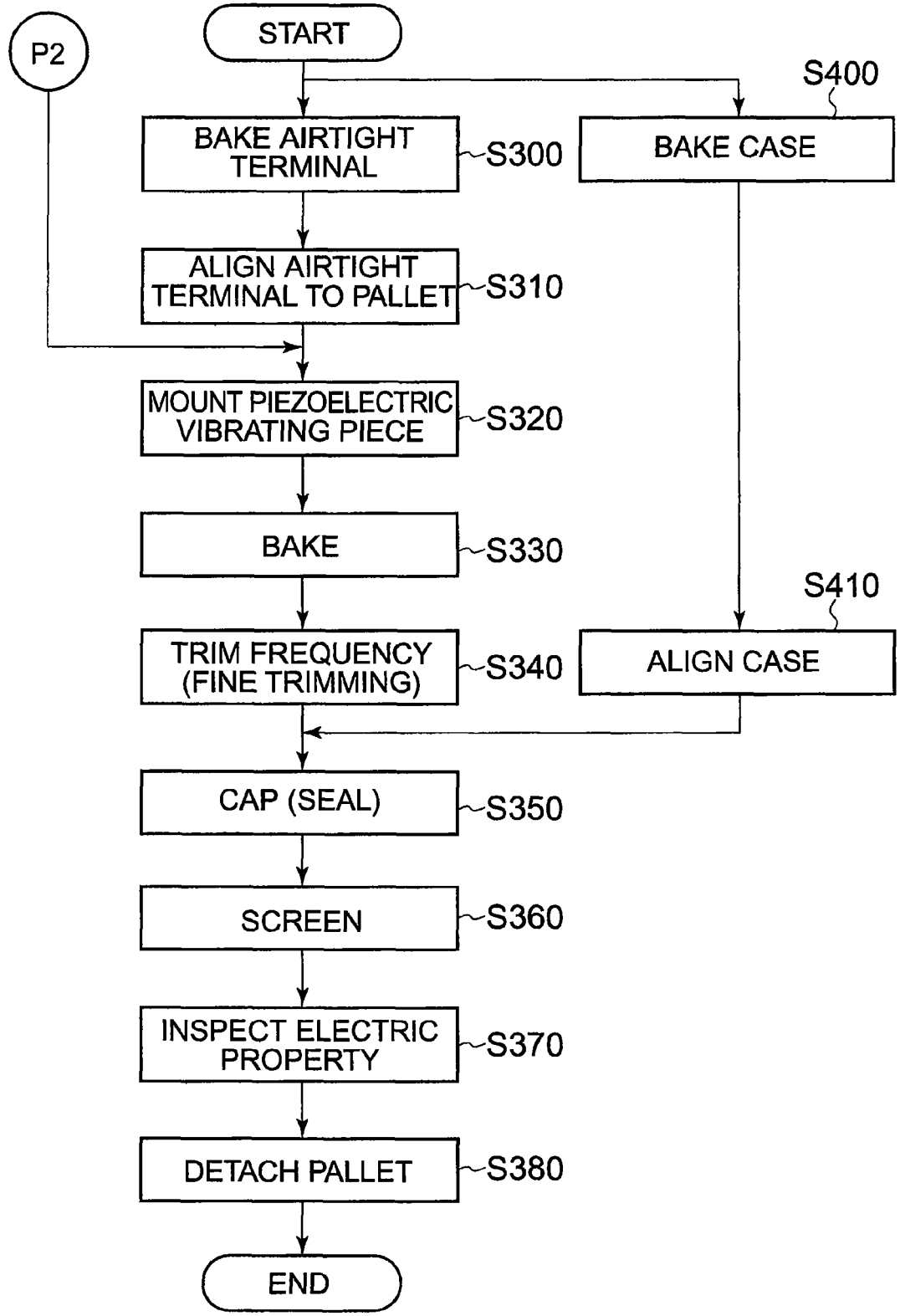
FIG. 17 is a flowchart showing steps of fabricating a piezoelectric vibrator.

Next, an explanation will be given of steps of fabricating a small-sized piezoelectric vibrator in accordance with fabrication flowcharts shown in FIG. 16 and FIG. 17 as Embodiment 6 of the invention.

First, steps of fabricating a piezoelectric vibrating piece will be explained in reference to FIG. 16, next, integrating steps using the airtight terminal of the invention will be explained in reference to FIG. 17. Here, although an explanation will be given by taking an example of a tuning fork quartz crystal vibrator, the invention is applicable also to a case of an AT vibrator or a BT vibrator constituting other oscillation mode of quartz by pertinently changing the steps. Further, the invention is applicable also to a case of an oscillator using other piezoelectric material of $LiNbO_3$ or $LiTaO_3$.

In steps of fabricating a piezoelectric vibrating piece, first, Lambert stone of quartz is set to a work table by using an X-ray diffraction method to constitute a predetermined cutting angle (step 100).

Next, the quartz stone is sliced by a cutting apparatus of, for example, a wire saw or the like to cut to a thickness of about 200 μm. In cutting, normally, isolated abrasive grains are commonly used, further, as a wire for cutting, a high carbon steel wire having a wire diameter of, for example, about 160 μm is used (step 110).

Next, a wafer is polished to constitute a constant thickness. In polishing, normally rough lapping is carried out by isolated abrasive grains having a coarse grain size, successively, finish lapping is carried out by using isolated abrasive grains having a fine grain size. Thereafter, after removing a work denatured layer by etching the surface, polishing is carried out to finish to a mirror face having a predetermined flatness (step 120). The thickness of the wafer becomes thin in accordance with downsizing the piezoelectric vibrating piece, and becomes substantially 50 μm when a total of a length of the piezoelectric vibrating piece is about 1600 μm as described above.

Successively, the wafer is cleaned by pure water or ultra pure water (step 130), dried, thereafter, deposited with a metal thin film (laminated film of chromium and gold is commonly used) for masking by film forming means of sputtering or the like (step 140). The thin film is deposited on both faces of the wafer.

Next, an outer shape of a tuning fork type quartz crystal vibrator is formed by a lithography technology (step 150). Specifically, after coating a resist, the both faces are exposed by masks for the outer shape, developed to provide a resist pattern of the outer shape. Thereafter, by removing an unnecessary metal pattern by an etching solution, a mask pattern of a metal is provided. After removing the resist, by etching quartz by an aqueous solution of fluoric acid species to form a plurality of the outer shapes on the wafer. Normally, a ratio of the width of the vibrating arm to the thickness of the vibrating arm becomes a small numerical value in accordance with downsizing the vibrator. Particularly when the ratio becomes smaller than 1.0, an electric field efficiency with regard to the vibrating arm of the quartz crystal vibrator is reduced and a resonance resistance value of the vibrator is increased to a value exceeding, for example, 100 kΩ, which is not preferable for the vibrator. As a countermeasure thereagainst, a groove is formed at the vibrating arm with an object of reducing the resonance resistance value by increasing the electric field efficiency.

After forming the outer shape and the groove in this way, all of the metal film used as the mask is temporarily exfoliated (step 160).

After the exfoliation, a metal thin film constituting an electrode film is deposited on the both faces of the wafer again by a predetermined film thickness by sputtering or the like (step 170).

When the groove is formed, the film is formed also at an inner face of the groove. After depositing the film, by using the lithography technology similar to the outer shape forming step, a pattern of the electrode film is formed (step 180).

Next, a front end region of the vibrating arm of the wafer formed with the pattern of the electrode film is formed with a film for laminating by a thickness of several micrometers (step 190). As a material for laminating, a laminated film of chromium or silver or gold is commonly used.

The next is a frequency trimming step (rough trimming). A weight of laminating is trimmed by evaporating a portion of the laminated film deposited in the preceding step by irradiating laser or the like to the laminated portion in the atmosphere while measuring an oscillation frequency. Thereby, the oscillation frequency of a tuning fork type quartz crystal vibrator is matched to a predetermined range (step 200).

After trimming the frequency, ultrasonic cleaning of the wafer is carried out to remove a residue of the film or an adhered foreign matter generated by trimming the frequency or the like (step 210). By the above-described steps, the wafer including a plurality of the piezoelectric vibrating pieces is finished.

Successively, an explanation will be given in accordance with a fabrication flowchart of integrating steps shown in FIG. 17. The airtight terminal 10 fabricated by the above-described method is baked at a predetermined temperature to isolate moisture or the like adsorbed to a surface thereof in storing (step 300).

On the other hand, also the case 30 is subjected to a baking processing in vacuum to isolate moisture adsorbed to a surface thereof (step 400). Successively, a plurality of pieces of the airtight terminals are aligned in a pallet by using jigs (step 310).

The next is a mounting step (step 320). The piezoelectric vibrating piece 20 fabricated in accordance with the fabrication flowchart of FIG. 16, the inner lead 12a of the airtight terminal 10 as well as the conductive lead 16 are bonded.

In the mounting step, first, positions of the inner lead 12a and the conductive lead 16, the mount pads 21a, 21b of the piezoelectric vibrating piece 20 are aligned.

Next, the metal films of the inner lead 12a and the conductive lead 16 are melted by applying heat from outside to be bonded to the mount pads 21a, 21b. As means for melting the metal films, various means of heated nitrogen gas, laser irradiation, further, heating by a light source and utilization of arc discharge heat and the like can be carried out.

Further, the mounting can also be carried out by means of a conductive adhesive, a solder bump, a solder ball or the like without melting the metal films of the inner lead 12a and the conductive lead 16.

After the mounting step, baking is carried out by heating at a predetermined temperature at inside of a vacuum apparatus to thereby remove strain of the piezoelectric vibrating piece generated in the mounting step (step 330). When the conductive adhesive is used, after a step of curing the adhesive, a gas component of the adhesive is discharged by holding the piezoelectric vibrating piece at a high temperature.

The next is a frequency trimming step (fine trimming). The respective pallets are carried out to inside of a vacuum apparatus, for example, the stem 11 and the outer lead 12b are probed, while measuring the oscillation frequency, laser is irradiated to the arm of the piezoelectric vibrating piece 20, the metal film for trimming is evaporated to thereby trim the frequency (step 340). In trimming the frequency, also a system of trimming by sputtering the surface of the thin film by irradiating ions of inert gas to the metal thin film for trimming the frequency can be carried out.

Thereafter, a plurality of pieces of the pallets including the oscillation pieces the frequencies of which have been trimmed are aligned at inside of the die, and the case 30 for sealing is aligned to be opposed thereto (step 410). Here, there is selected a material of a jig for aligning to hold the case 30 having a low discharge gas characteristic of a metal or the like. In order to isolate moisture or a gas component adsorbed in steps before sealing, sufficient vacuum heating is carried out at inside of a sealing apparatus. After heating, the case 30 can be caped thereto to seal in airtight in vacuum (step 350).

Thereafter, screening is carried out at a predetermined temperature with an object of stabilizing the oscillation frequency (step 360).

After screening, in an electric property inspecting apparatus, electric properties of a resonance frequency, a resonance resistance value and the like are measured (step 370). In an electric property inspection, the stem 11 of the vibrator or the case 30 and the outer lead 12b are probed. After finishing measurement, the piezoelectric vibrator 1 is detached from the pallet (step 380). The piezoelectric vibrator 1 (refer to FIG. 1) is finished by the above-described steps.

Embodiment 7

Example of Applying to Tuning Fork Type Quartz Oscillator

Figure 18:
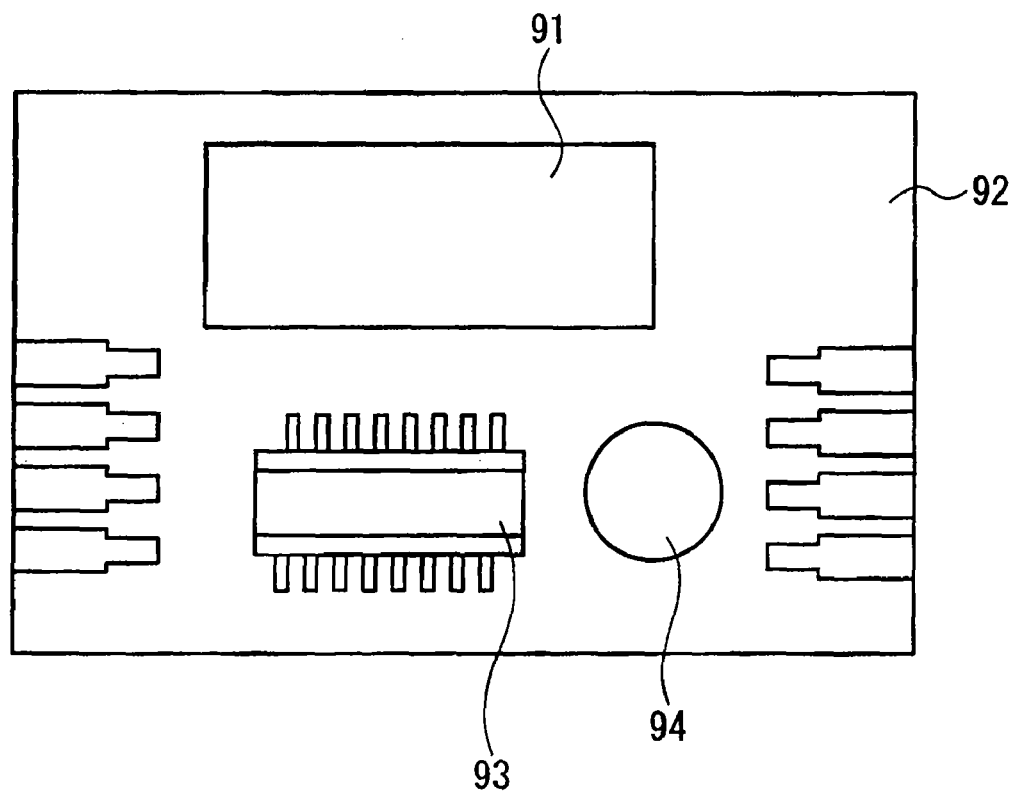
FIG. 18 is an outline constitution view showing a constitution of an oscillator.

Next, Embodiment 7 of the invention will be described. FIG. 18 is an outline schematic view showing a constitution of a tuning fork type quartz oscillator according to the invention, showing a plane view of a surface mount type piezoelectric oscillator utilizing the above-described piezoelectric vibrator 1.

In FIG. 18, a tuning fork type quartz crystal vibrator 91 is a surface mount type vibrator utilizing a piezoelectric vibrator (refer to FIG. 1). The tuning fork type quartz crystal vibrator 91 is set to a predetermined position of a board 92, and an integrated circuit 93 for an oscillator is installed contiguous to the tuning fork type quartz crystal vibrator 91. Further, an electronic part 94 of a capacitor or the like is also mounted. The respective parts are electrically connected by a wiring pattern, not illustrated. Mechanical vibration of a piezoelectric vibrating piece of the tuning fork type quartz crystal vibrator 91 is converted into an electric signal by a piezoelectric characteristic provided to quartz to be inputted to the integrated circuit 93. A signal processing is carried out at inside of the integrated circuit 93, a frequency signal is outputted to function as the oscillator. The respective constituent parts are molded by a resin, not illustrated. By pertinently selecting RTC (real time clock) module or the like as the integrated circuit 93, other than as a single function oscillator for a timepiece, there is provided a function of controlling day or time of operating the apparatus or an outside apparatus and providing time or calendar information to a user.

By using the piezoelectric vibrator fabricated by the fabricating method of the invention, the vibrator having a largest volume in the parts constituting the oscillator can be downsized. Therefore, an outer shape dimension of the oscillator can further be downsized. Further, since the rigidity of the lead connected to the piezoelectric vibrating piece is increased, even when an apparatus including the oscillator is mechanically impacted as in dropping or the like, a failure of inclining the piezoelectric vibrating piece to be brought into contact with the case to shortcircuit or the like can be restrained, and product reliability is promoted. Therefore, downsizing can be realized and a transmitting function can be maintained over a long period of time.

Embodiment 8

Example of Applying to Portable Information Apparatus

Next, Embodiment 8 of the invention will be described. Here, an explanation will be given of an example of an electronic apparatus connected to a time counting portion of the piezoelectric vibrator 1 fabricated by the fabricating method of the invention. As an example of an electronic apparatus, a detailed explanation will be given of a preferable embodiment of a portable information apparatus represented by a portable telephone.

First, as a premise, a portable information apparatus according to the embodiment is constituted by developing and improving a wristwatch in the background art. An outlook thereof is similar to a wristwatch, a liquid crystal display is arranged at a portion in correspondence with a dial and current time or the like can be displayed on a screen thereof. When used as a communication machine, the apparatus is detached from the wrist, and communication similar to that of a portable telephone of a background art can be carried out by a speaker and a microphone included on an inner side of a strap portion. However, the apparatus is significantly small-sized and light-weighted in comparison with the portable telephone of the background art.

Figure 19:
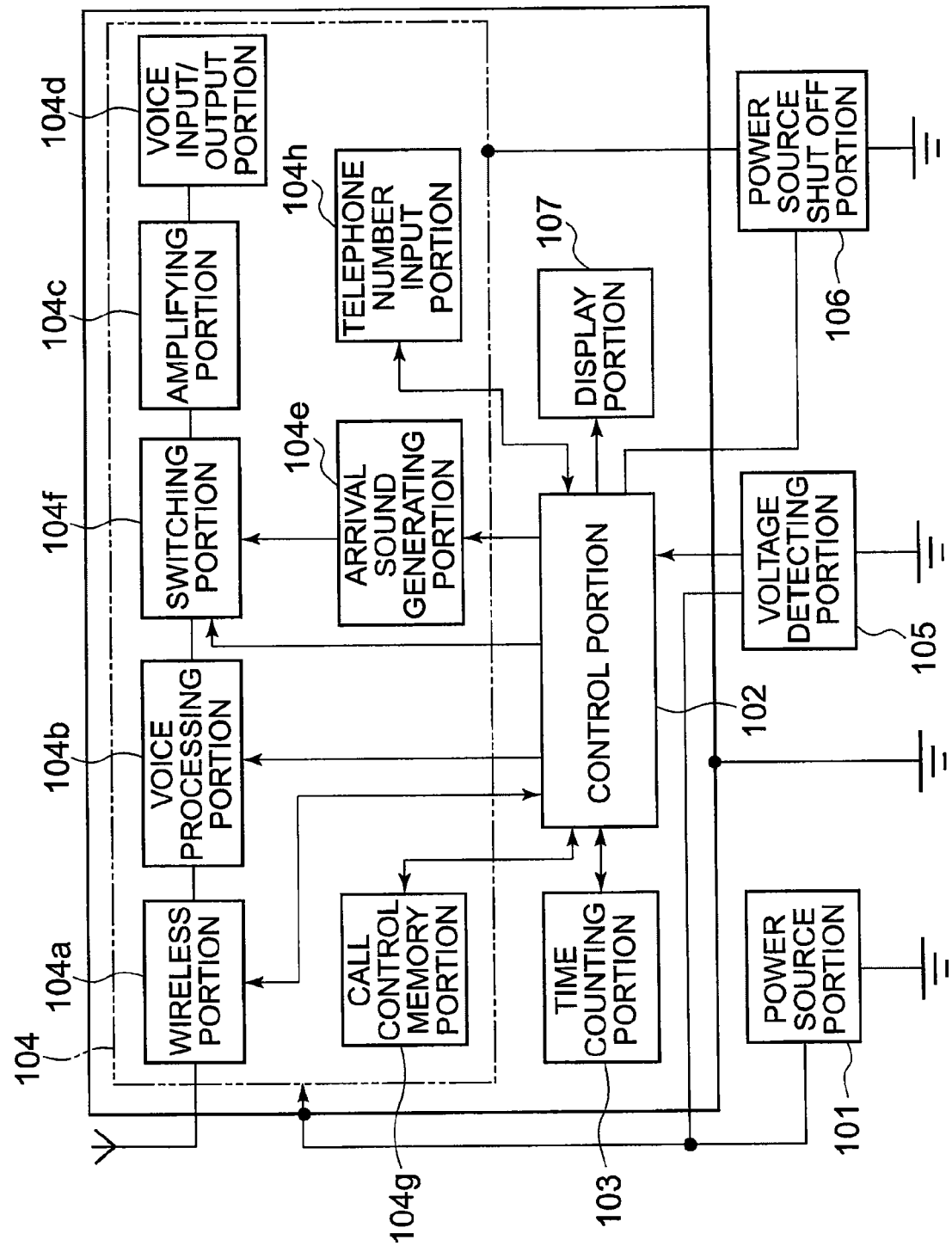
FIG. 19 is an outline constitution diagram showing a constitution of a portable information apparatus.

Next, an explanation will be given of a functional constitution of the portable telephone information apparatus according to the embodiment of the invention in reference to the drawing. FIG. 19 is a block diagram functionally showing a constitution of the portable information apparatus according to the embodiment.

In FIG. 19, numeral 101 designates a power source portion for supplying power to respective functional portions, mentioned later, which is specifically realized by a lithium ion secondary battery. The power source portion 101 is connected in parallel with a control portion 102, a time counting portion 103, a communicating portion 104, a voltage detecting portion 105 and a display portion 107, and power is supplied from the power source portion 101 to the respective functional portions.

The control portion 102 controls operation of a total of a system such as transmission and reception of voice data, measurement and display of current time or the like by controlling the respective functional portions, mentioned later. The control portion 102 is specifically realized by a program previously written to ROM, CPU executing by reading the program, RAM used as a work area of the CPU or the like.

The time counting portion 103 is constituted by an integrated circuit including an oscillating circuit, a register circuit, a counter circuit, an interface circuit and the like and a tuning fork type quartz crystal vibrator constituted by using the piezoelectric vibrator 1 shown in FIG. 1. Mechanical vibration of the tuning fork type quartz crystal vibrator is converted into an electric signal by a piezoelectric characteristic provided to quartz, and is inputted to an oscillating circuit formed by a transistor and a capacitor. An output of the oscillating circuit is binalyzed and is counted by the register circuit and the counter circuit. Transmission/reception of a signal is carried out to and from the control portion by way of the interface circuit, and current time or current date or calendar information is displayed on the display portion 107.

The communicating portion 104 is provided with a function similar to that of the portable telephone of the background art and is constituted by a wireless portion 104a, a voice processing portion 104b, an amplifying portion 104c, a voice input/output portion 104d, an arrival sound generating portion 104e, a switching portion 104f, a call control memory portion 104g and a telephone number input portion 104h.

The wireless portion 104a transmits/receives various data of voice date or the like to and from a base station by way of an antenna. The voice processing portion 104b codes/decodes a voice signal inputted from the wireless portion 104a or the amplifying portion 104c, mentioned later. The amplifying portion 104c amplifies a signal inputted from the voice processing portion 104b or the voice input/output portion 104d, mentioned later, to a predetermined level. The voice input/output portion 104d is specifically a speaker and a microphone for emitting arrival sound or received speech sound, or collecting voice of a speaker.

Further, the arrival sound generating portion 104e generates arrival sound in accordance with call from the base station. The switching portion 104f switches the amplifying portion 104c connected to the voice processing portion 104b to connect to the arrival sound generating portion 104e only in arrival of a signal, thereby, generated arrival sound is outputted to the voice input/output portion 104d by way of the amplifying portion 104c.

Further, the call control memory 104g is stored with a program with regard to an emission and arrival call program of communication. Further, the telephone input portion 104h specifically comprises number keys of 0 through 9 and other several keys for inputting a telephone number or the like of a counter party.

When a voltage applied to the respective functional portions starting from the control portion 102 by the power source portion 101 becomes lower than a predetermined value, the voltage detecting portion 105 detects the voltage drop to be informed to the control portion 102. The predetermined voltage value is a value previously set as a minimum voltage necessary for stably operating the communicating portion 104, and is, for example, a voltage of about 3 V. The control portion 102 prohibits operation of the wireless portion 104a, the voice processing portion 104b, the switching portion 104f, the arrival sound generating portion 104e upon receiving notice of the voltage drop from the voltage detecting portion 105. Particularly, it is indispensable to stop operating the wireless portion 104a having a large power consumption. Simultaneously therewith, the display portion 107 is displayed with a statement that the communicating portion 104 cannot be used by a deficiency in a remaining amount of the battery.

The operation of the communicating portion 104 can be prohibited and statement can be displayed on the display portion 107 by operating the voltage detecting portion 105 and the control portion 102.

According to the embodiment, the function of the communicating portion can be stopped in a further complete form by providing a power shut off portion 106 capable of selectively shutting off the power source of a portion related to the function of the communicating portion.

Further, although the display of the statement that the communicating portion 104 cannot be used may be carried out by a character message, the display may be carried out also by a method of a x (check) mark to a telephone icon on the display portion 107 further intuitively.

By using the small-sized piezoelectric vibrator fabricated by the fabricating method of the invention in the portable information apparatus, the portable electronic apparatus can further be downsized. Further, since the rigidity of the lead connected to the piezoelectric vibrating piece is increased, even when the portable information apparatus is mechanically impacted as in dropping or the like, a failure of inclining the piezoelectric vibrating piece to be brought into contact with the case to shortcircuit or the like can be restrained, and product reliability is promoted. Therefore, downsizing is realized and the portable electronic apparatus can be used solidly over a long period of time.

Embodiment 9

Example of Applying to Radio Wave Timepiece

Figure 20:
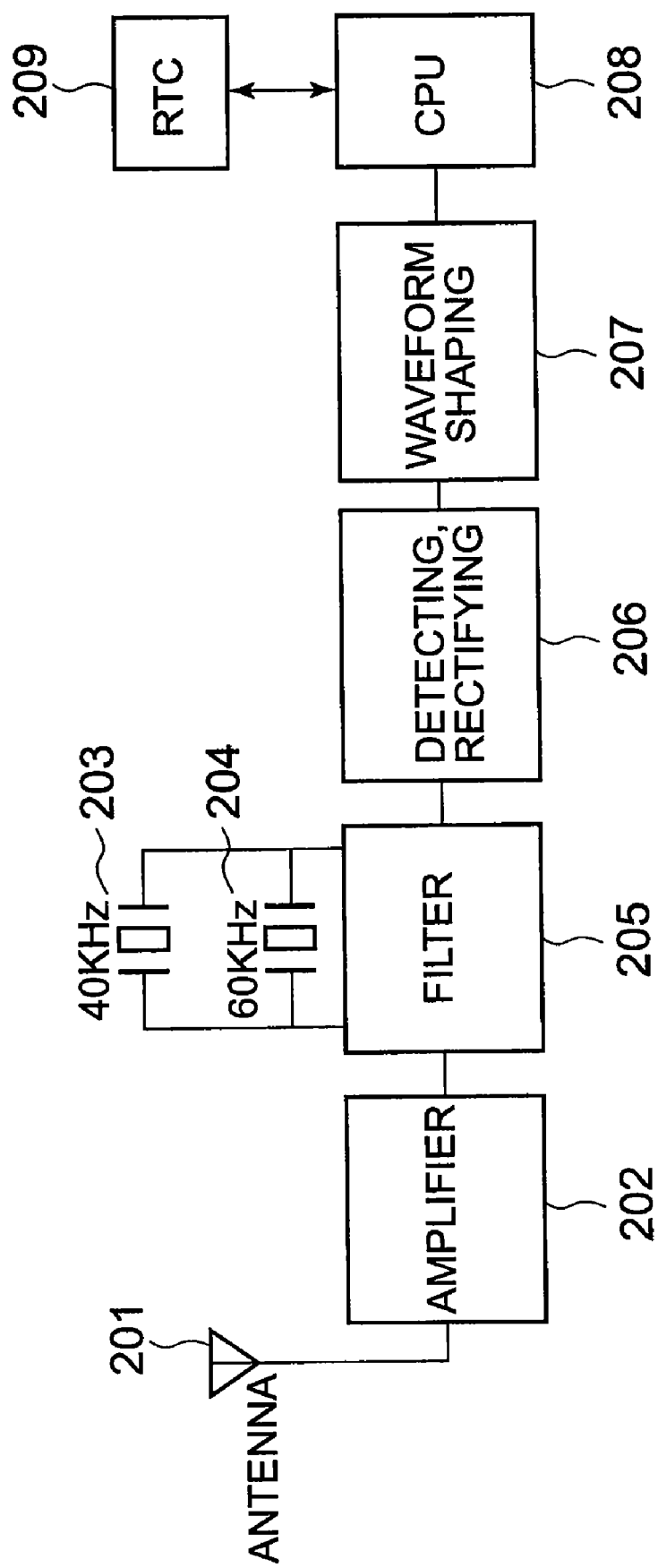
FIG. 20 is a block diagram showing a circuit of a radio wave timepiece.
Figure 21A:
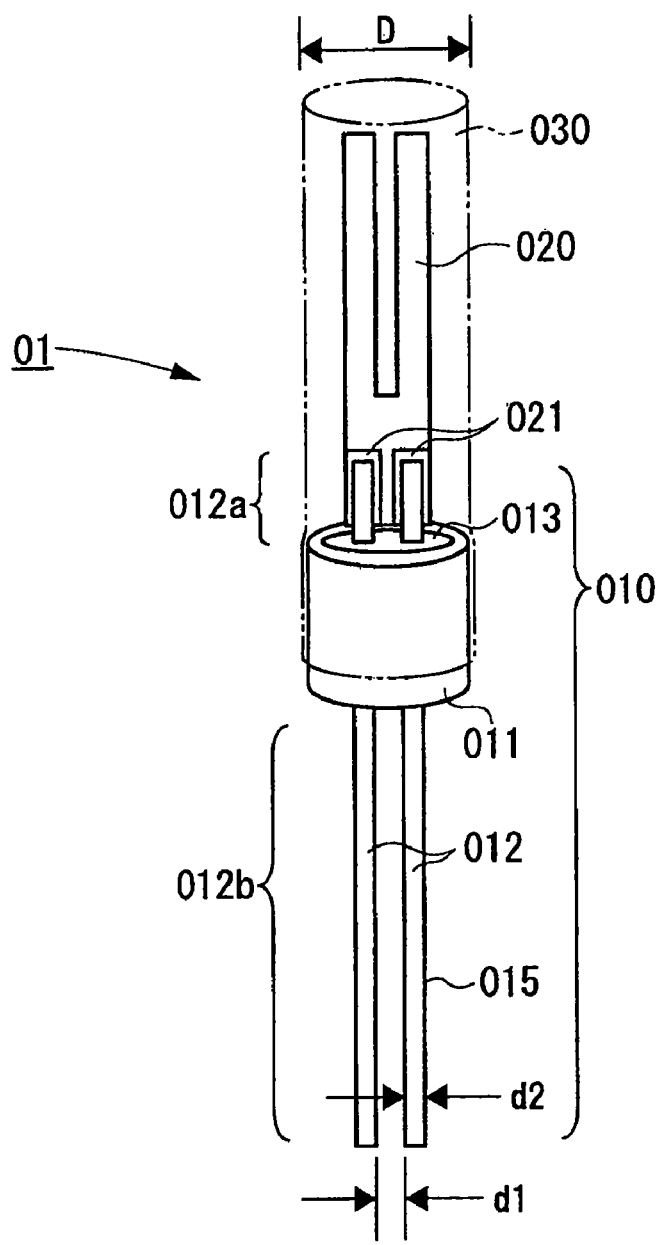
Figure 21B:
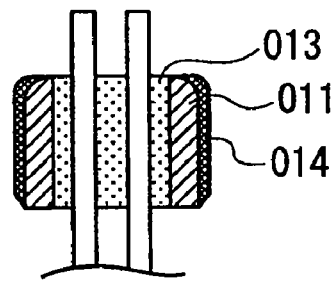

FIG. 20 is an outline view showing a circuit block of a radio wave timepiece as an electronic apparatus according to a ninth embodiment of the invention. This is an example of connecting a tuning fork type quartz crystal vibrator constituted by the piezoelectric vibrator 1 to a filter portion of a radio wave timepiece to be used thereby.

A radio wave timepiece is a timepiece having a function of automatically collecting time to accurate time to be displayed by receiving a standard radio wave including time information. In Japan, there are transmitting facilities (transmitting stations) for transmitting standard radio waves in Fukushima prefecture (40 KHz) and Saga prefecture (60 KHz), for respectively receiving the standard radio waves. A long wave of 40 KHz or 60 KHz is provided with a property of propagating on the ground surface and a property of propagating while being reflected by the ionized layer and the ground surface and therefore, propagating ranges thereof are wide and a total of Japan is covered by the two transmitting facilities.

In FIG. 20, an antenna 201 receives the standard radio wave of the long wave of 40 KHz or 60 KHz. The standard radio wave of the long wave is constituted by subjecting time information referred to as a time code to AM modulation in a carrier wave of 40 KHz or 60 KHz.

The received standard radio wave of the long wave is amplified by an amplifier 202, successively filtered to be tuned by a filter portion 205 including quartz crystal vibrators 203, 204 having resonance frequencies the same as those of carrier frequencies. The filter signal having the predetermined frequency is detected to be decoded by a detecting and rectifying circuit 206. Successively, the time code is outputted by way of a waveform shaping circuit 207 to be counted by CPU 208. Read information is reflected to RTC 209 to display accurate time information.

Since the carrier wave is constituted by 40 KHz or 60 KHz, as the quartz crystal vibrators 203, 204 constituting the filter portion, the vibrator having the structure of the tuning fork type is preferable. Taking an example of 60 KHz, as an example of dimensions of the tuning fork type vibrating piece, the example is constituted by dimensions of a total length of about 2.8 mm, a width dimension of a base portion of about 0.5 mm.

There is constructed a constitution of connecting the piezoelectric vibrator fabricated by the fabricating method according to the invention to an electronic apparatus, particularly to a filter portion of a radio wave timepiece to be used and therefore, the radio wave timepiece can further be downsized. It seems that in the future, 2 through 3 pieces of the vibrators for the radio wave timepiece are needed for the one radio wave timepiece to deal with a plurality of frequencies. Therefore, downsizing of the vibrator is extremely useful.

What is claimed is:

1. An airtight terminal comprising:
   a stem made of a circumferential wall defining a hollow inside and having two ends;
   only one piece of an elongated lead arranged to extend through the inside of the stem such that the lead constitutes an inner lead which extends out from one end of the stem and an outer lead which extends out from the other end of the stem;
   a filling member filled at inside of the stem for fixing and supporting the lead at inside of the stem; and
   a conductive lead electrically and mechanically connected to the stem on a side of said one end of the stem.

2. The airtight terminal according to claim 1, wherein the lead is formed with a filling member positioning portion laterally extending from the lead to position the filling member with respect to the lead.

3. The airtight terminal according to claim 1, wherein the conductive lead is integrally formed with the stem.

4. The airtight terminal according to claim 1, wherein the conductive lead is made of a conductive member connected to the stem.

5. A piezoelectric vibrator comprising:

the airtight terminal according to claim 1;

a piezoelectric vibrating piece formed thereon with electrodes which are connected respectively to the inner lead and the conductive lead; and a case capped on said one end of the stem to hermetically enclose cover the inner lead, the conductive lead and the piezoelectric vibrating piece.

6. The piezoelectric vibrator according to claim 5, wherein the piezoelectric vibrating piece is a tuning fork type quartz crystal vibrating piece.

7. The piezoelectric vibrator according to claim 5, wherein the piezoelectric vibrating piece is a quartz crystal vibrating piece of vibrating under a thickness sliding vibration mode.

8. The piezoelectric vibrator according to claim 5, wherein the inner lead is connected to an electrode formed on one face of the piezoelectric vibrating piece, and the conductive lead is connected to the other electrode formed on the other face of the piezoelectric vibrating piece.

9. The piezoelectric vibrator according to claim 5, wherein the inner lead has a surface with lateral sides, at least partially along which flanges elevate respectively from the surface, and the piezoelectric vibrating piece is placed on the surface between the franges.

10. The piezoelectric vibrator according to claim 5, wherein the lead is positioned inside the stem such that the piezoelectric vibrating piece connected to the lead is substantially centered with respect to the stem.

11. An oscillator comprising the piezoelectric vibrator according to claim 5, which is connected to an integrated circuit as an oscillating piece.

12. An electronic apparatus comprising the piezoelectric vibrator according to claim 5, which is used in a time counter of the electronic apparatus.

13. A radio wave timepiece comprising the piezoelectric vibrator according to claim 5, which is used in a filter portion of the radio wave timepiece.

\* \* \* \* \*